US006940125B2

(12) United States Patent
Kianian et al.

(10) Patent No.: US 6,940,125 B2
(45) Date of Patent: Sep. 6, 2005

(54) VERTICAL NROM AND METHODS FOR MAKING THEREOF

(75) Inventors: Sohrab Kianian, Los Altos Hills, CA (US); Dana Lee, Santa Clara, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 77 days.

(21) Appl. No.: 10/407,627

(22) Filed: Apr. 4, 2003

(65) Prior Publication Data

US 2004/0031984 A1 Feb. 19, 2004

Related U.S. Application Data

(60) Provisional application No. 60/404,629, filed on Aug. 19, 2002.

(51) Int. Cl.[7] ................................................ H01L 29/76
(52) U.S. Cl. ........................ 257/330; 257/329; 438/270
(58) Field of Search ................................ 257/324, 329, 257/330; 438/259, 270

(56) References Cited

U.S. PATENT DOCUMENTS 5,768,192 A 6/1998 Eitan ..................... 365/185.24
6,011,725 A 1/2000 Eitan ..................... 365/185.33
6,486,028 B1 * 11/2002 Chang et al. ............... 438/259
6,773,994 B2 * 8/2004 Chittipeddi et al. ........ 438/268
2003/0235076 A1 * 12/2003 Forbes .................. 365/185.03

* cited by examiner

*Primary Examiner*—Christian Wilson
(74) *Attorney, Agent, or Firm*—DLA Piper Rudnick Gray Cary US LLP

(57) ABSTRACT

Vertical NROM devices are made in a substantially single crystalline silicon substrate having a planar surface. The vertical NROM cell and device has a first region and a second region spaced apart from one another by a channel. A dielectric is spaced apart from the channel to capture charges injected from the channel onto the dielectric. A gate is positioned over the dielectric and spaced apart therefrom and controls the flow of current through the channel. In the improvement of the present invention, a portion of the channel is substantially perpendicular to the top planar surface of the substrate. Methods for making the vertical NROM cell and array are also disclosed.

23 Claims, 36 Drawing Sheets

VERTICAL NROM AND METHODS FOR MAKING THEREOF

The present application claims the priority of U.S. Provisional Application No. 60/404,629, filed on Aug. 19, 2002, whose disclosure is incorporated herein in its entirety by reference.

TECHNICAL FIELD

The present invention relates to vertical nonvolatile read-only memories (NROM) and more particularly to vertical NROMs and methods for making thereof.

BACKGROUND OF THE INVENTION

An NROM device is a nonvolatile read-only memory electronic memory device which stores charges in a dielectric layer and is well-known in the art. Referring to FIG. 12, there is shown a cross-sectional view of an NROM device 10 of the prior art. In the NROM device 10 of the prior art, the device 10 is made from a silicon substrate 12 with a first conductivity type and a first region 14 and second region 16, spaced apart from one another, which are of a second conductivity type opposite the first conductivity type of the silicon substrate 12. Separating the first region 14 from the second region 16 is a channel region 18. A first insulating layer 20 such as silicon oxide or silicon dioxide is over the channel region 18. A dielectric 22, such as silicon nitride, is positioned "over" the silicon dioxide layer 20. A second insulating layer 24 such as another layer of silicon dioxide 24 is positioned over the dielectric 22. Collectively the first insulating layer 20, the dielectric layer 22 and the second dielectric layer 24 are also known as an ONO layer 20–24. Finally, a polysilicon gate 26 is positioned adjacent to the second layer silicon dioxide 24. Thus, the dielectric 22 is spaced apart and is insulated from the channel region 18 via the first insulating layer 20. The polysilicon gate 26 is insulated and separated from the dielectric 24 by the second insulating layer of silicon dioxide 24. In summary, the polysilicon gate 26 is spaced apart and separated from the channel region 18 by the ONO layer 20–24.

The NROM device 10 is a double density, nonvolatile storage cell, capable of storing 2 bits in a cell. The polysilicon layer 26 serves as the gate and controls the flow of current between the first region 14 and the second regions 16 through the channel region 18. To program one of the bits, the polysilicon gate 26 is raised to a high positive voltage. The first region 14 is held at or near ground and the second region 16 is raised to a high positive voltage. Electrons from the first region 14 accelerate into the channel 18 towards the second channel 16 and through hot channel electron injection mechanism are injected through the first oxide layer 20 and are trapped in the dielectric 22 near the region 30 of the dielectric layer 22. Since the dielectric layer 22, comprising of silicon nitrite is a nonconductive material, the charges are trapped in the region 30.

To program the other bit of the cell 10, the polysilicon layer 26 is raised to a high positive voltage. The second region 16 is held at or near ground and the first region 14 is raised to a high positive voltage. Electrons from the second region 16 accelerate in the channel towards the first region 14 and through hot channel electron injection mechanism are injected through the first silicon dioxide layer 20 and are trapped in the region 28 of the silicon nitride layer 24. Again, since the silicon nitride layer 24 is nonconductive, the charges are trapped in the region 28.

To read one of the bits, the first region 14 is held near ground. A positive bias voltage is applied to the polysilicon layer 26. The voltage applied as such that if the region 28 does not contain trapped charges or is not programmed, it will cause the channel region 18 underneath it to be conductive. However, if the region 28 has trapped charges or is programmed, there will not be a channel to conduct. A positive voltage is also applied to the second region 16. The voltage applied to the second region 16 is such that it causes a depletion region of the second region 16 to expand and encroach the channel region 18 so that it is beyond the region 30. Thus, the state of whether region 30 is programmed or not is irrelevant. Therefore, under that condition, the state of conduction of the channel between the first region 14 and the second region 14 is dependent solely on the state of charge stored or trapped in the region 28.

To read the other bit, the voltages applied are simply reversed. Thus, the second region 16 is held near ground. A positive bias voltage is applied to the polysilicon layer 26. The voltage applied is such that if region 30 is not programmed, it will cause the channel region 18 underneath it to be conductive. However, if region 30 is programmed, there will not be a channel to conduct. A positive voltage is also applied to the first region 14. The voltage applied to first region 14 is such that it causes the depletion region of the first region 14 to expand and encroach into the channel region 18 so that the state of charge stored or trapped in region 28 is irrelevant.

To erase, the substrate 12, the first region 14, and the second region 16, may be connected to a high positive voltage thereby causing Fowler/Nordheim tunneling of electrons from the trapped regions 28 and 30 to tunnel into the substrate 12.

The problem with the NROM cell 10 of the prior art is that the channel 18 is on the planar surface of the silicon substrate 12. The channel region 18 lies in a plane between the first region 14 and the second region 16. Thus, it requires the channel region 18 to be sufficiently large so that the two trapped regions 28 and 30 may be sufficiently separated. This becomes a problem as a cell 10 is scaled to a smaller size. In addition, the thickness of the ONO layers 22–26 cannot be scaled.

SUMMARY OF THE INVENTION

In the present invention, a nonvolatile memory device comprises a substantially single crystalline semiconductive material of a first conductivity type, has a planar surface. A first region of a second conductivity type, different from the first conductivity type is in the semiconductive material. A second region of the second conductivity type is also in the semiconductive material. A channel region connects the first and second regions for the conduction of charges. A dielectric is spaced apart from the channel region for trapping charges. A gate electrode is spaced apart from the dielectric for controlling the conduction of charges in the channel region. Finally, the channel region has a portion which is substantially perpendicular to the planar surface.

The present invention also relates to a nonvolatile memory array comprising a plurality of aforementioned memory cells. Further, pairs of adjacent memory cells share a common first region.

The present invention also comprises a number of methods for making a nonvolatile memory array of the foregoing type.

BRIEF DESCRIPTION OF THE DRAWINGS

FIGS. 5A–5L are perspective and cross-sectional views of a second method of making the first embodiment of the vertical NROM cell and array of the present invention shown in FIG. 1.

FIGS. 8A–8L are perspective and cross-sectional views of a third method of making the second embodiment of the vertical NROM cell and array of the present invention shown in FIG. 2.

DETAILED DESCRIPTION OF THE INVENTION

Figure 1:
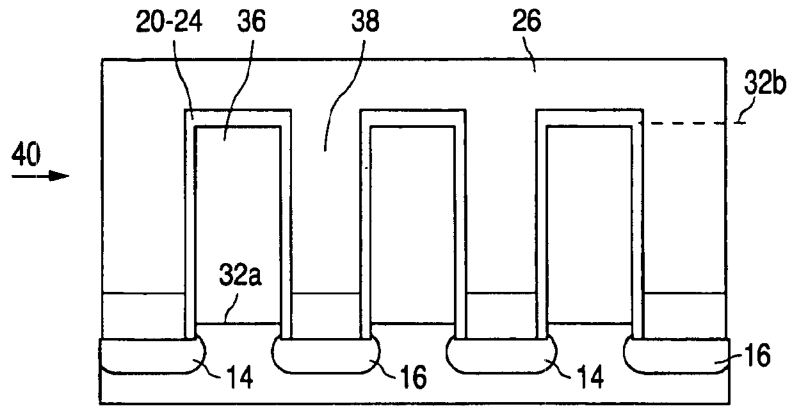
FIG. 1 is a cross-sectional view of a first embodiment of a vertical NROM cell and array of the present invention.

Referring to FIG. 1, there is shown a cross-sectional view of a vertical NROM device 40 of the present invention. The device 40 comprises a plurality of vertical NROM cells. Similar to the NROM cell 10 shown in FIG. 12, the vertical NROM device 40 of the present invention comprises a single crystalline silicon substrate 12 of a first conductivity type. A first region 14 and a second region 16 of a second conductivity type are in the substrate 12. The first region 14 and the second region 16 are separated by a channel region 18. Unlike the prior art, however, the channel region 18 is not planar. Instead, as shown in FIG. 1, the channel region 18 comprises a region on the outskirts of a pillar 36 rising above a planar surface 32A of the silicon substrate 12. Thus, the channel region 18 has a portion which is perpendicular to the planar surface 32A, a portion which is parallel to the planar surface 32A, and another region which is substantially perpendicular to the planar surface 32A. The pillar 36 can be polysilicon grown above the planar surface 32A of the substrate 12 and then recrystallized to form a substantially single crystalline silicon 36. Alternatively, the pillars 36 can be a part of the substrate 12 and the regions 38 between adjacent pillars 36 are trenches in the silicon substrate 12 which has a top planar surface 32B. In that event, there is no need to form polycrystalline growth above the plane of surface 32A and recrystallizing it. Instead, the pillar 36 can be naturally part of the substrate 12 with trenches 38 cut into the substrate 12 below the planar surface 32B.

Figure 12:
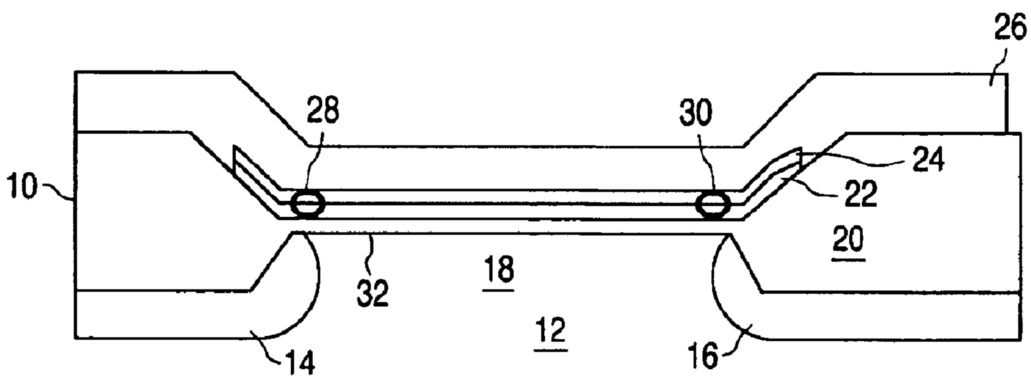
FIG. 12 is a cross-sectional view of a planar NROM cell of the prior art.

Immediately adjacent to and positioned against the channel region 18 is an ONO layer 20–24 similar to that shown and described in FIG. 12. The ONO layer 20–24 comprises a first insulating layer 20 of silicon dioxide, with a layer of dieletric such as silicon nitride 22 to capture or trap the electrons, and a second layer of silicon dioxide 24. Finally, insulated from the channel region 18 but controlling the conduction of the charges traversing the channel region 18 is the polysilicon layer 26, which fills the trenches 38. As can be seen from FIG. 1, each vertical NROM cell 40 comprises a first region 14 and a second region 16 with the first region 14 shared in common between adjacent vertical NROM cells 40 and with the second region 16 also commonly shared by adjacent vertical NROM cells 40.

Each vertical NROM cell 40 has the channel region 18 which traverses the length of the pillar 36, across the width thereof, and down the length of the pillar 36 again. Thus, the total length of the channel 18 is equal to twice the height of the pillar 36 plus its width. As can be seen from FIG. 1, the first embodiment of the vertical NROM device 40 has its first and second regions 14 and 16 respectively positioned below the trench region 38. If the silicon substrate 12 has a top plane of surface 32B, then the trench 38 has a top portion and a bottom portion with the first and second regions 14 and 16 being adjacent to the bottom region. The channel region 18 has a side wall which is substantially along the side wall of the trench connecting the top portion and the bottom portion of the trench 38.

A polysilicon layer 26 is in the trench 38 and connects the gates of all the vertical NROM cells in the horizontal direction. The first regions 14 and second regions 16 traverse in a direction perpendicular through the paper of the drawing shown in FIG. 2 and connect the vertical NROM cells that are in and out of the planes of the drawing shown in FIG. 2. Thus, an array of the vertical NROM cells are formed.

Figure 2:
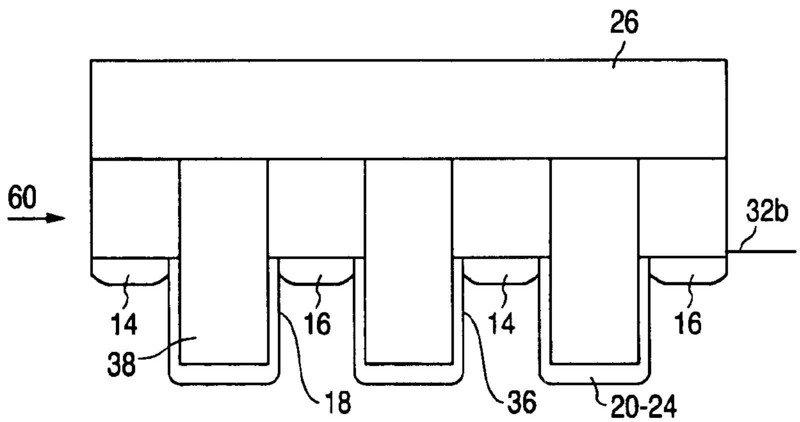
FIG. 2 is a cross-section view of a second embodiment of a vertical NROM cell and array of the present invention.

Referring to FIG. 2 there is shown a second embodiment of a vertical NROM device 60 of the present invention. Similar to the first embodiment of the NROM device 40 of the present invention shown in FIG. 1, the vertical NROM device 60 is comprised of a single crystalline silicon substrate 12 having a top planar surface 32. Trenches 38 are provided in the silicon substrate 12. The trenches 38 have a top portion, a bottom portion, with a side wall connecting the top portion and the bottom portion. The vertical NROM device 60 also comprises a plurality of vertical NROM cells which each cell having a first region 14 and a second region 16 of a second conductivity type opposite the first conductivity type of the silicon substrate 12. The first region 14 and the second region 16 are spaced apart from one another by the channel region 18. Again, similar to the discussion for the vertical NROM device 40, each pair of adjacent cells shares a common second region 16 and each pair of adjacent cells share a common first region 14. However, unlike the vertical NROM device 40 shown in FIG. 1, the first region 14 and the second region 16 are substantially near the top portion of the trench 38 and is in the region between adjacent trenches 38. The channel traverses along the side wall and the bottom portion and the side wall again of the trench 38 between the first region 14 and the second region 16.

Similar to the vertical NROM cell 40 shown in the device 40 of FIG. 1, the channel region of each vertical NROM cell shown in the device 60 comprise twice the length of the side wall of the trench 38 and the width of the bottom portion of the trench 38.

Figure 3A:
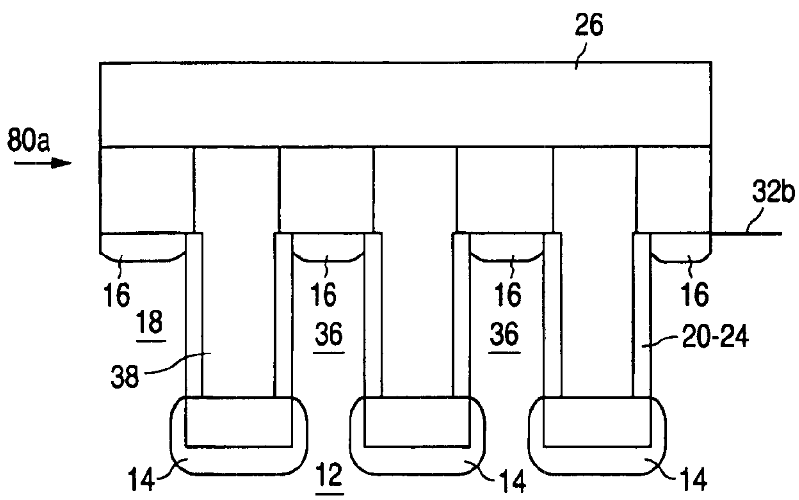
FIGS. 3A and 3B are cross-section views of a third embodiment of a vertical NROM cell and array of the present invention. The embodiments shown in FIGS. 3A and 3B are structurally similar, but differ based upon the methods of making.

Referring to FIG. 3A, there is shown a third embodiment of a vertical NROM device 80A of the present invention. The vertical NROM device 80A comprises a plurality of vertical NROM cells with each pair of adjacent NROM cells sharing a common first region 14 and each other pair of adjacent and vertical NROM cells 80A sharing a common second region 16. Similar to all of the discussion for the other vertical NROM devices, the vertical NROM device 80A is made of single crystalline silicon substrate 12 of a first conductivity type in which are formed first and second regions 14 and 16 of a second conductivity type. The first and second regions 14 and 16 are spaced apart with a channel region 18 therebetween. In the embodiment shown in FIG. 3A, the silicon substrate 12 has a top planar surface 32B and has a plurality of trenches 38 cut therein. Each trench 38 has a top portion, a bottom portion and a side wall. The first regions 14 are positioned substantially adjacent to the bottom portion of the trenches 38. The second regions 16 are positioned adjacent to the top portion of each of the trenches 38. Thus, the channel region 18 is substantially along the side wall of each of the trenches 38, connecting the first region 14 and the second region 16. The trenches 38 are lined with ONO 20–24 and are filled with a polysilicon material 26 interconnecting the cells in the row of cells shown in FIG. 3A. The first and second regions 14 and 16 connect the column of cells that run perpendicular to the figure shown in FIG. 3A.

Figure 3B:
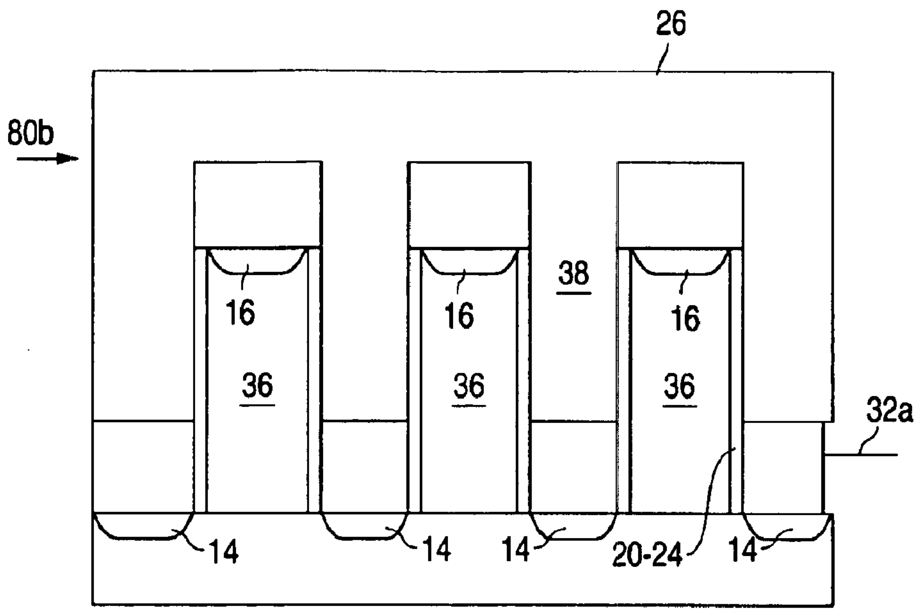

Referring to FIG. 3B, there is shown a cross-sectional view of another third embodiment 80B of the vertical NROM device 80B. The device 80B shown in FIG. 3B is identical in operation and theory to the device 80A shown in FIG. 3A. The only difference is that in the device 80B shown in FIG. 3B, the silicon substrate 12 has a planar surface 32A. Above the planar surface 32A are formed pillars of recrystallized polysilicon 26 (which are substantially single crystalline) with gaps 38 separating adjacent pillars 36. The gaps 38 are the equivalent of the trenches 38 shown in FIG. 3A and are filled with the ONO layer 20–24 and polysilicon 26.

Figure 4A:
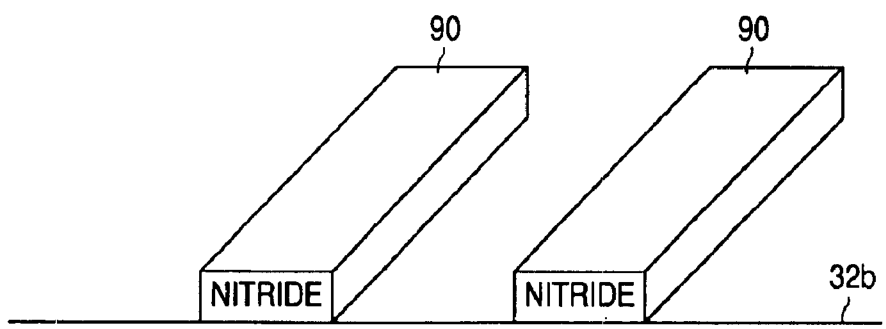
FIGS. 4A–4K are perspective and cross-sectional views of a first method of making the first embodiment of the vertical NROM cell and array of the present invention shown in FIG. 1.
Figure 4B:
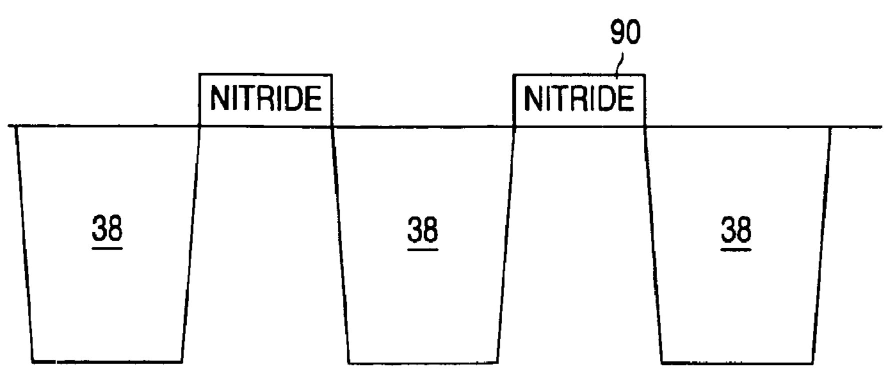

Referring to FIG. 4A, there is shown a first step in the method of making the vertical NROM device 40 shown in FIG. 1. The first step in the method of making the vertical NROM device 40 shown in FIG. 1 is to deposit spaced apart strips of approximately 500 angstrom thick silicon nitride layer on the top planar surface 32B of the silicon substrate 12. The height of each nitride strip 90 defines the thickness of the word line.

In the next step, trenches of approximately 2,000 angstroms deep are cut into the silicon substrate 12. An optional step at this point would be to have trench side wall implant which serves the function of reducing punch through as well as to set the threshold voltage of the channel. Each trench has a bottom portion 94, a top portion and a side wall.

Figure 4C:
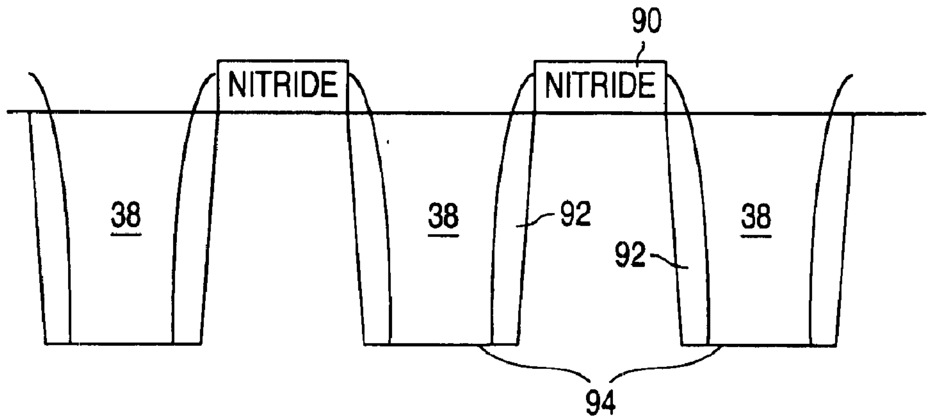
Figure 4D:
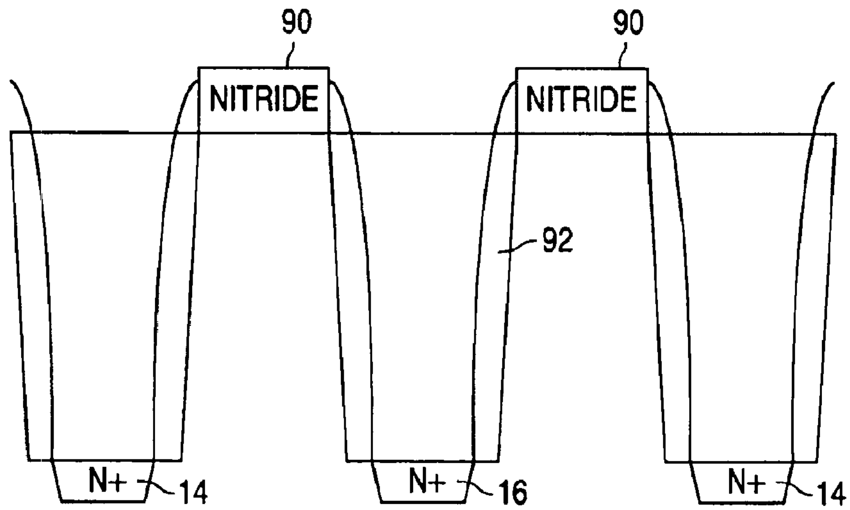

In the step that follows, shown in FIG. 4C, silicon dioxide spacers 92 are formed along the side walls of the trenches 38. The spacers 92 serve to narrow the width of the bottom portion 94 of the trench 38. Thus, when an implant step is formed as shown in FIG. 4D, which defines the first and second regions 14 and 16, which extend perpendicular to the drawing shown in FIG. 4D, the width of each of the regions 14 and 16 is defined by the opening at the bottom of the trenches 94. In the preferred embodiment, the implant is of an N+ material, such as phosphorus.

Figure 4E:
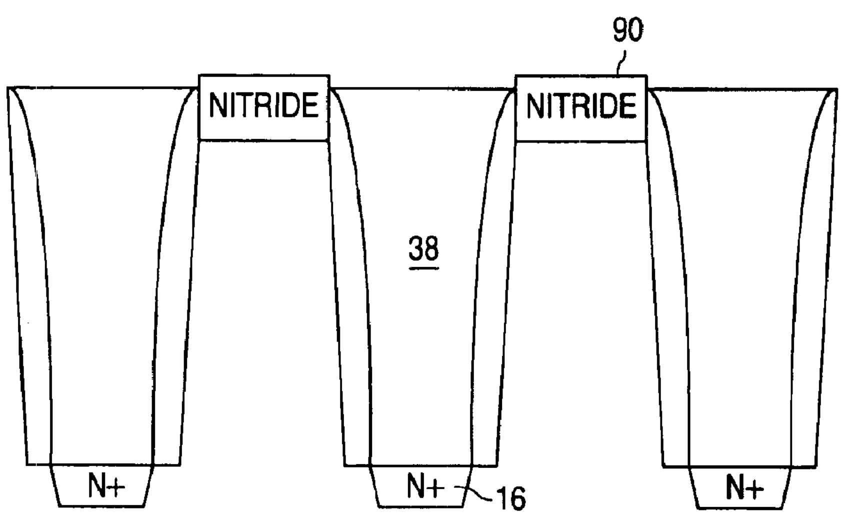
Figure 4F:
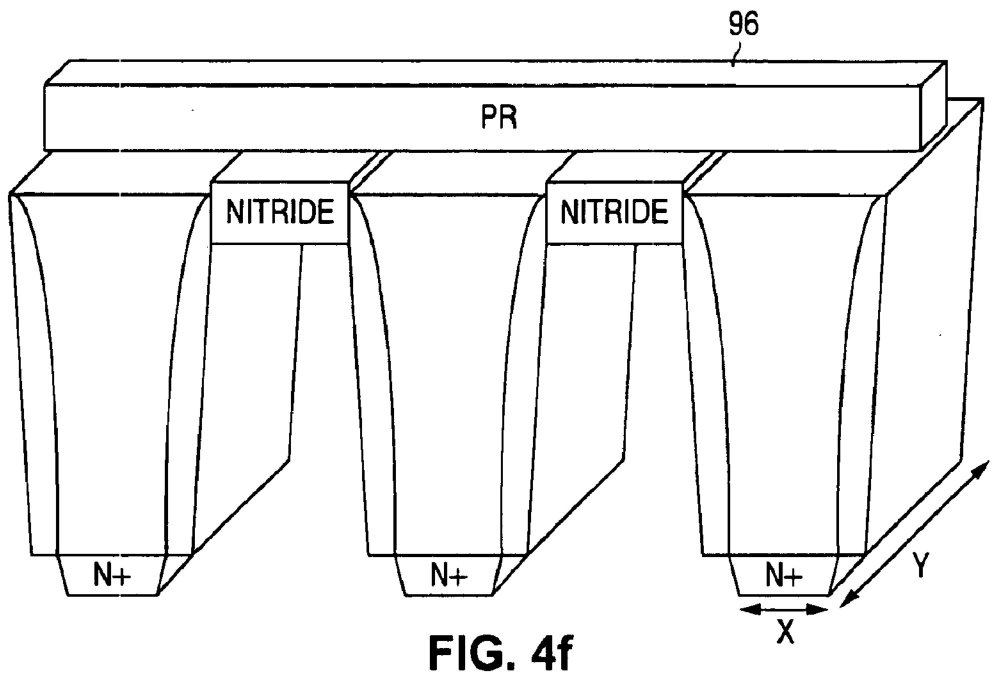
Figure 4G:
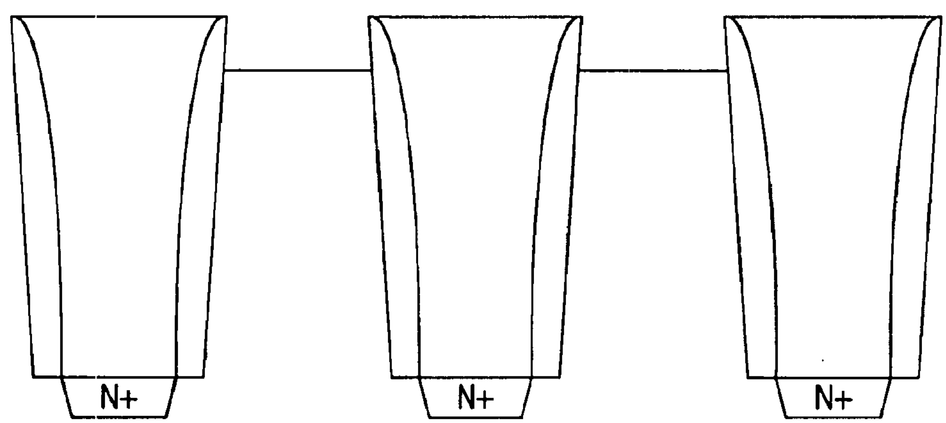
Figure 4H:
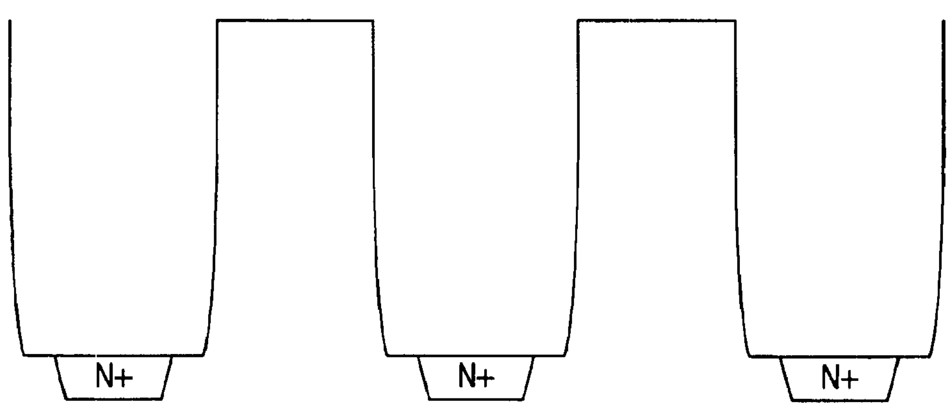

The trenches 38 are then filled by high density plasma (HDP) silicon dioxide process (see FIG. 4*e*). After the HDP silicon dioxide deposition process fills the trenches 38, a CMP polishing step is performed. After the trenches 38 are filled, photo resist and a masking step is performed in the Y direction and strips of photo resists 96 are formed (see FIG. 4*f*). These photo resist strips 96 define the word line in that they cover the isolation regions which separate word lines. Thus, the portion of the structure not covered by the photo resist 96 is exposed. The entire structure is then subject to a nitride anisotropic or dry etch to remove the nitride regions 90 which are not covered by the photo resist 96. The result is shown in FIG. 4G. After the nitride is removed, the structure is subject to a dry oxide etch to remove the oxide in the trenches 38 in the regions which are not covered by the photo resist 96. The result is shown in FIG. 4H.

Figure 4I:
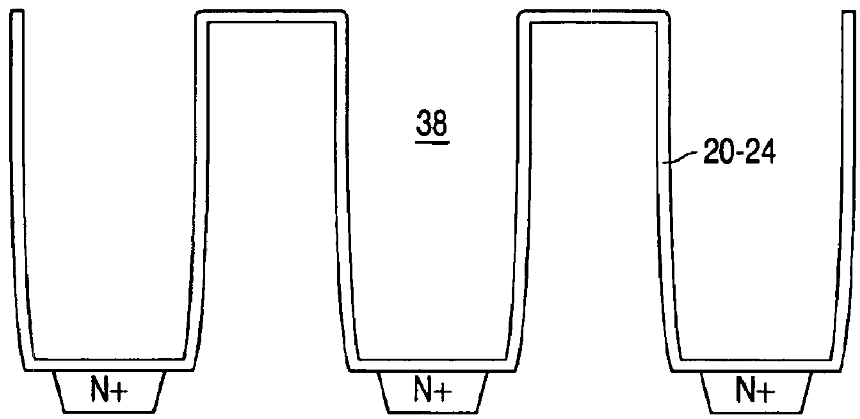

Thereafter, the photo resist strips 96 are removed, and the ONO layers 20, 22 and 24 are formed. The ONO layers 20, 22 and 24 are deposited in the trench regions 38 which have had their oxide removed. The result is shown in FIG. 4I which is a cross-sectional area of the structure through the region where the photo resist 96 did not cover the structure. As can be seen in FIG. 4I, the ONO layers 20, 22 and 24 are deposited in the trenches along the bottom portion 94 thereof, along the side wall, and between the trenches adjacent to the top portion. Thus, the ONO layers 20–24 extend continuously between adjacent trenches 38.

Figure 4J:
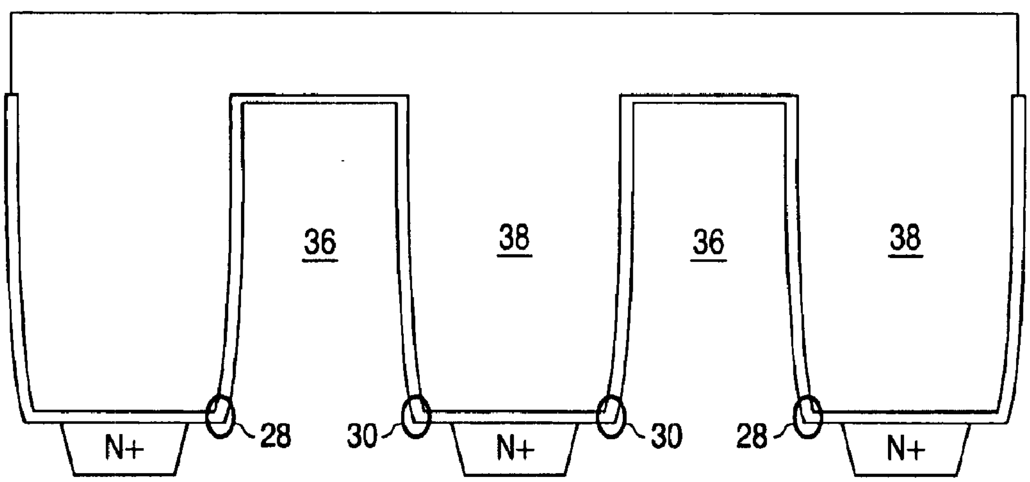
Figure 4K:
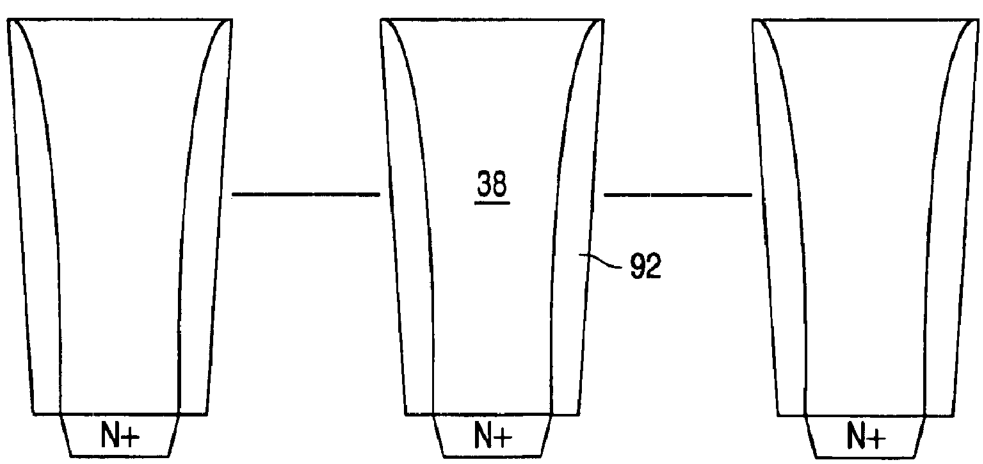

The structure shown in FIG. 4I is then filled with polysilicon 26 with a CMP polishing step performed to the level of the silicon nitride 90 which remains over the isolation region. The result is shown in FIG. 4J. The polysilicon 26 extends across in a row direction connecting the polysilicon in the adjacent trenches 38. Thereafter, the nitride in the isolation region is removed by a dry etch process. A cross-sectional view of the isolation region is shown in FIG. 4K. The trapping regions 28 and 30 for each NROM cell 40 where electrons may be trapped in the dielectric layer 24 are shown in FIG. 4J.

Figure 5A:
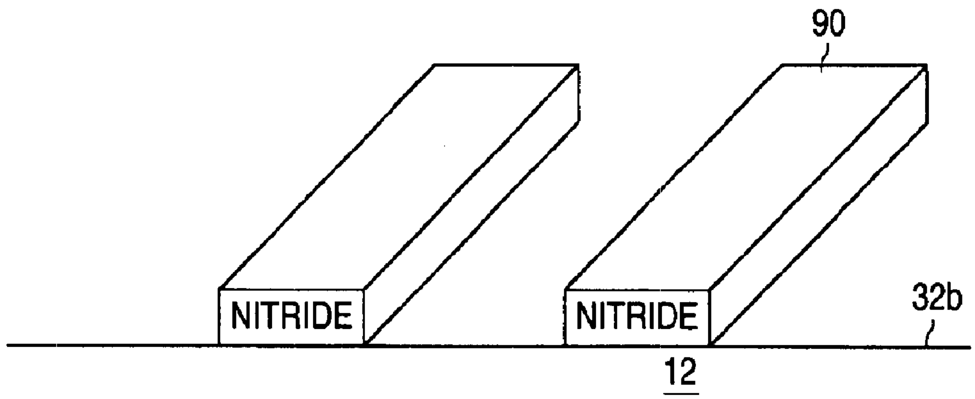
Figure 5B:
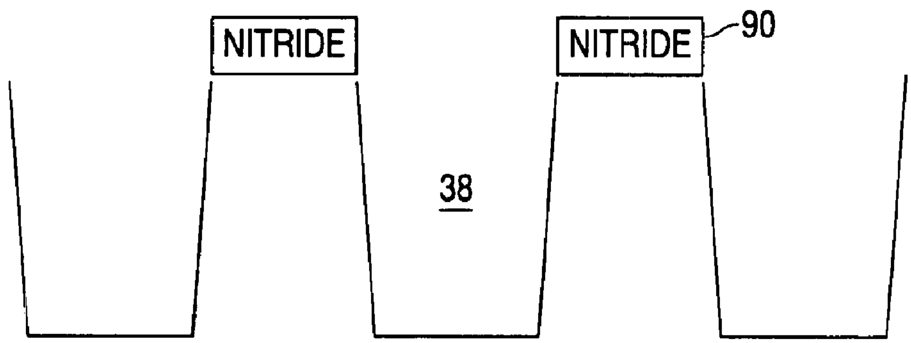
Figure 5C:
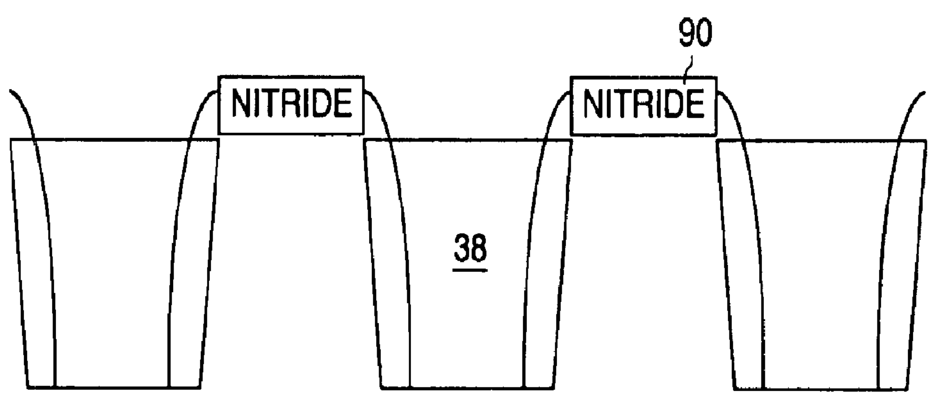
Figure 5D:
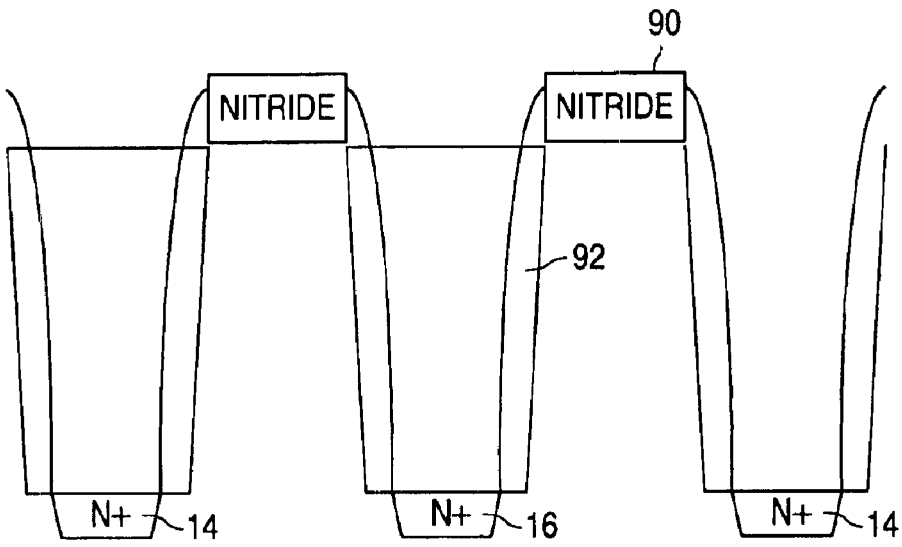

Referring to FIG. 5A, there is shown a first step in a second method of making the vertical NROM device 40 shown in FIG. 1. Steps 5A, 5B, 5C and 5D are identical to the steps shown and described for FIGS. 4A, 4B, 4C and 4D and are incorporated herein by reference.

Figure 5E:
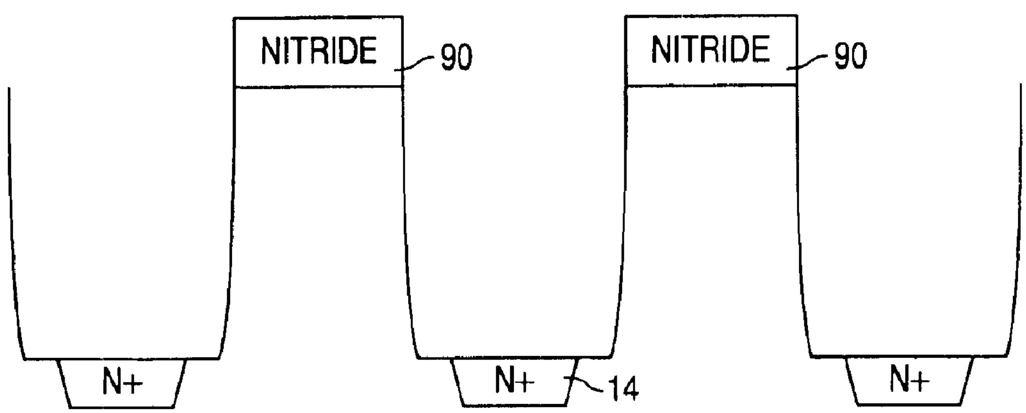

In the next step of the second method of the invention, the oxide spacers 92 are then removed. This can be done, for example, by a dry etch process. The resultant structure is shown in FIG. 5E.

Figure 5F:
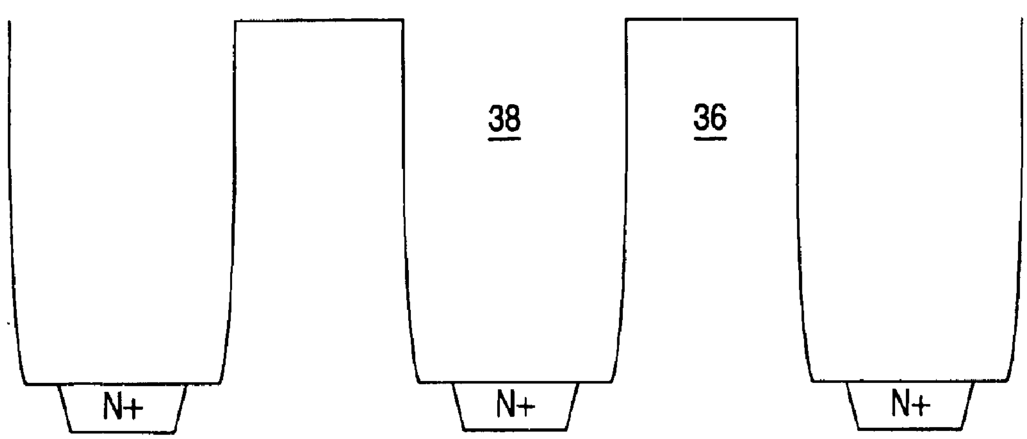
Figure 5G:
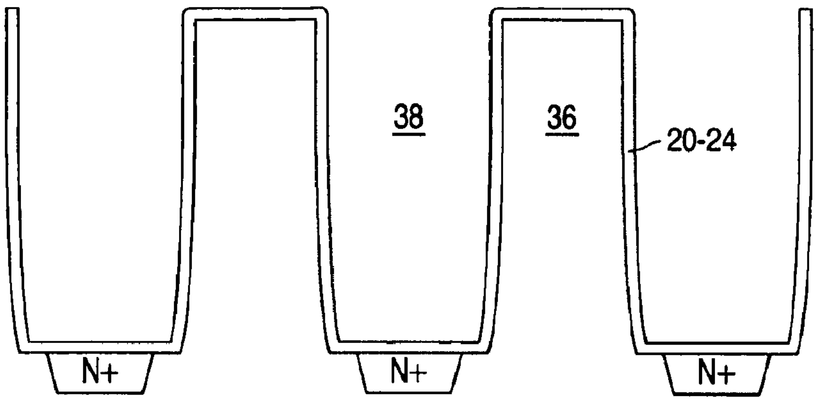

The nitride strips 90 are then removed by a dry etch or an isotropic etch process. The resultant structure is shown in FIG. 5F. At this point, the structure shown in FIG. 5F is similar to the structure shown in FIG. 4H, except the trenches run along the entire length of the device with no isolation between rows of vertical NROM cells. The ONO layers 20–24 are then applied and deposited along the bottom portion, side wall portion and the top portion of the trenches, with the ONO layers 20–24 being continuous in the row direction. The result is the structure shown in FIG. 5G.

Figure 5H:
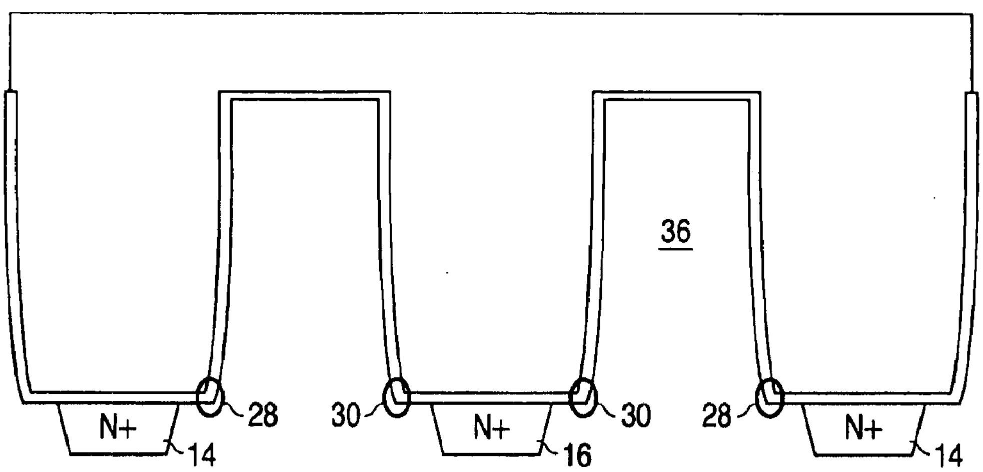
Figure 5I:
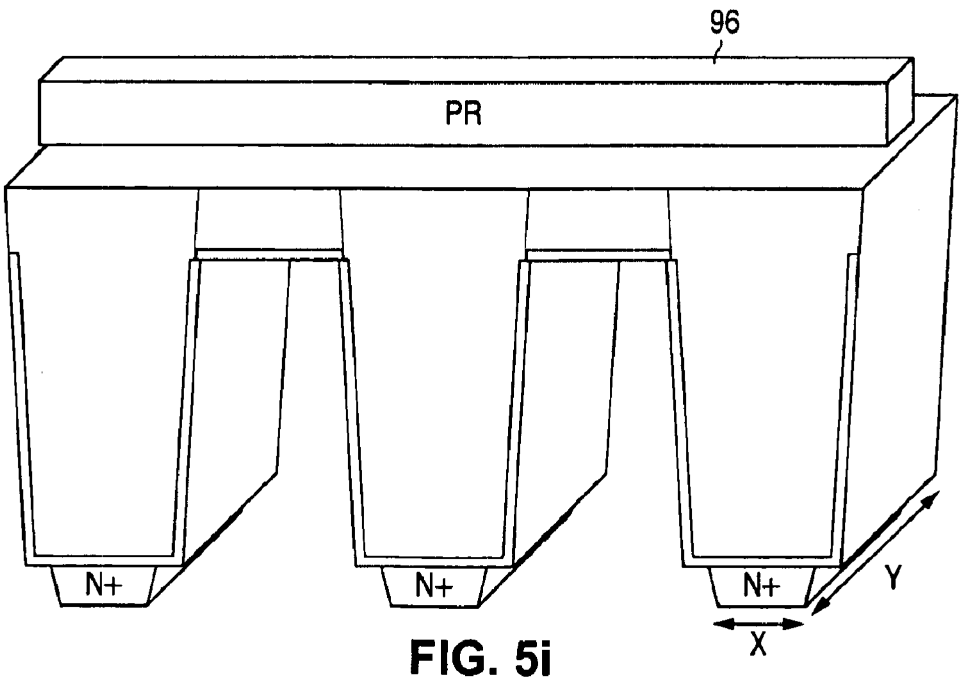
Figure 5J:
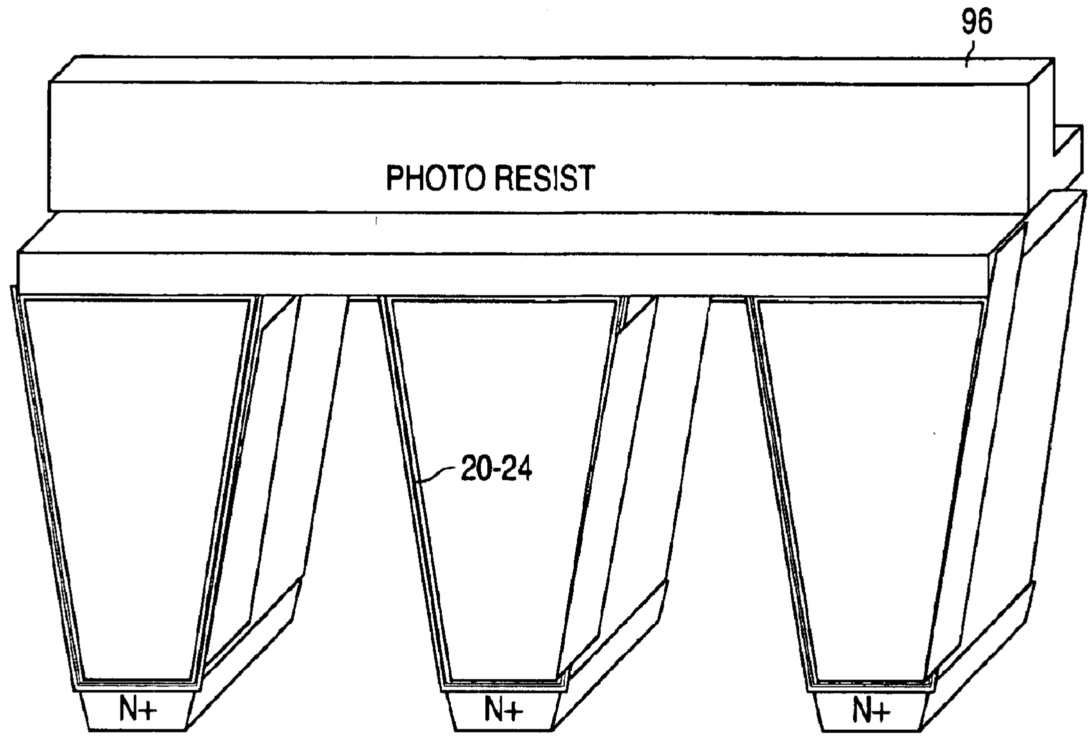
Figure 5K:
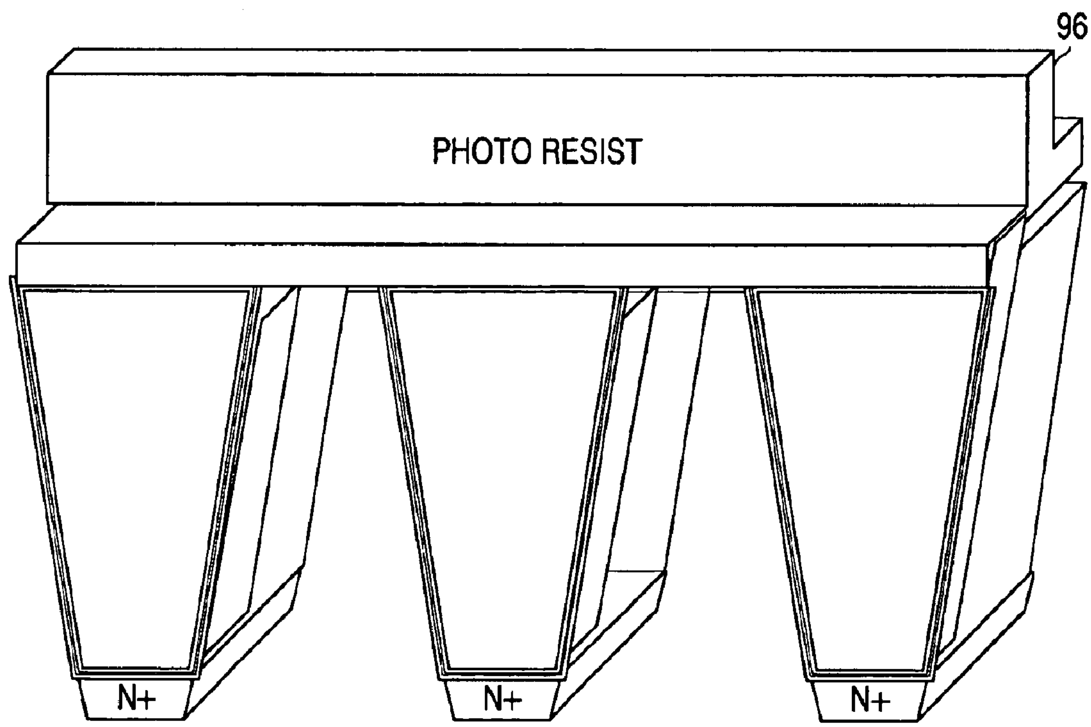
Figure 5I:
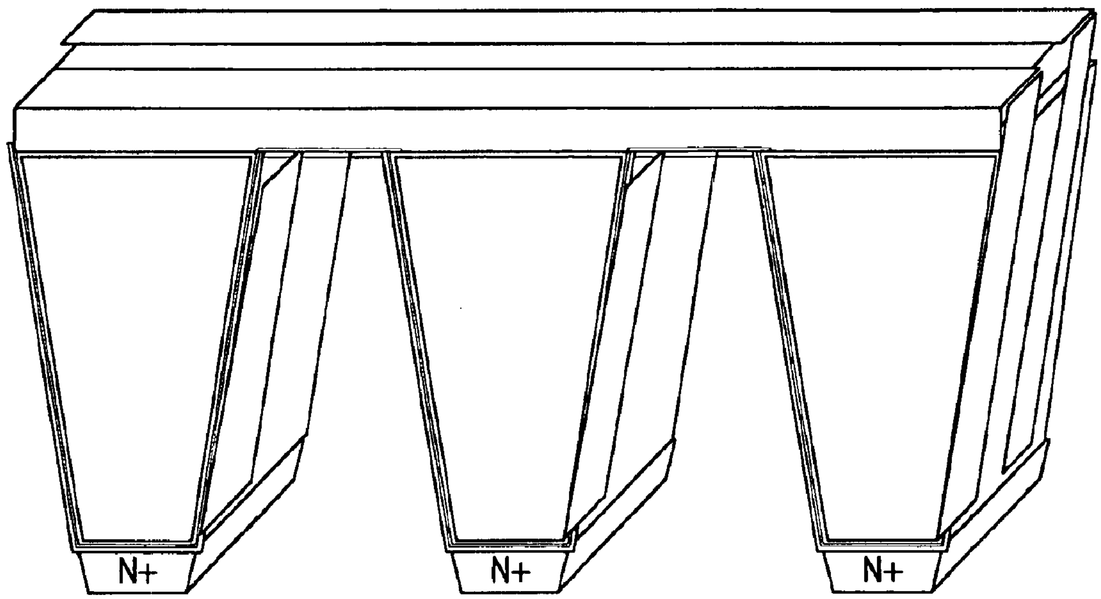

Thereafter, polysilicon 26 is deposited into each of the trenches 38 and form a continuous connection in the row direction among the plurality of vertical NROM cells in the row direction. Thus, the polysilicon 26 fills the trenches along the column direction. The result is the structure shown in FIG. 5H. In the next step of this method, photo resist strips 96 spaced apart from one another are placed in the Y direction as shown in FIG. 5I. In this case, the photo resist strips 96 protect the active regions that are underneath the photo resist strips 96. The polysilicon 26 that is not covered by the photo resist 96 is then removed by a dry etch process until the ONO layers 20–24 are reached. The resultant structure is shown in FIG. 5J. The exposed portion of the trenches 38 are then filled with silicon dioxide or any other suitable insulated material which serves as an isolation. The result is shown in FIG. 5K. Finally, the photo resist 96 is removed and the resultant structure is shown in FIG. 5L.

Figure 6A:
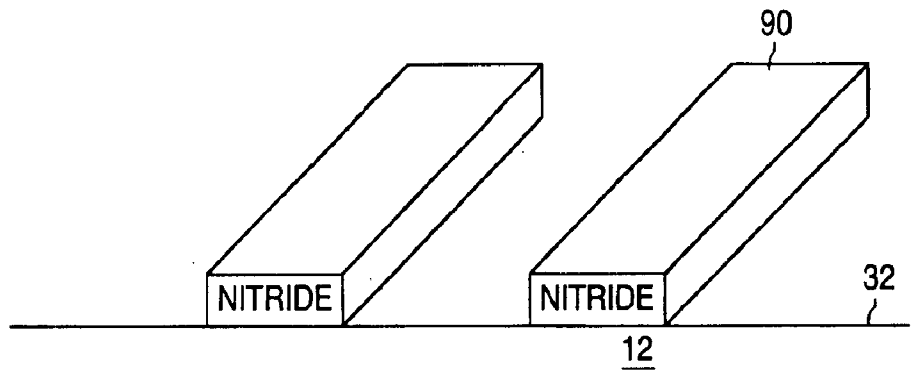
FIGS. 6A–6J are perspective and cross-sectional views of a first method of making the second embodiment of the vertical NROM cell and array of the present invention shown in FIG. 2.
Figure 6B:
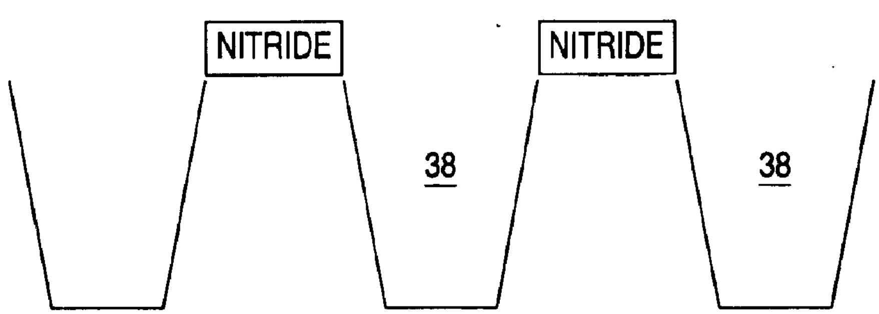
Figure 6C:
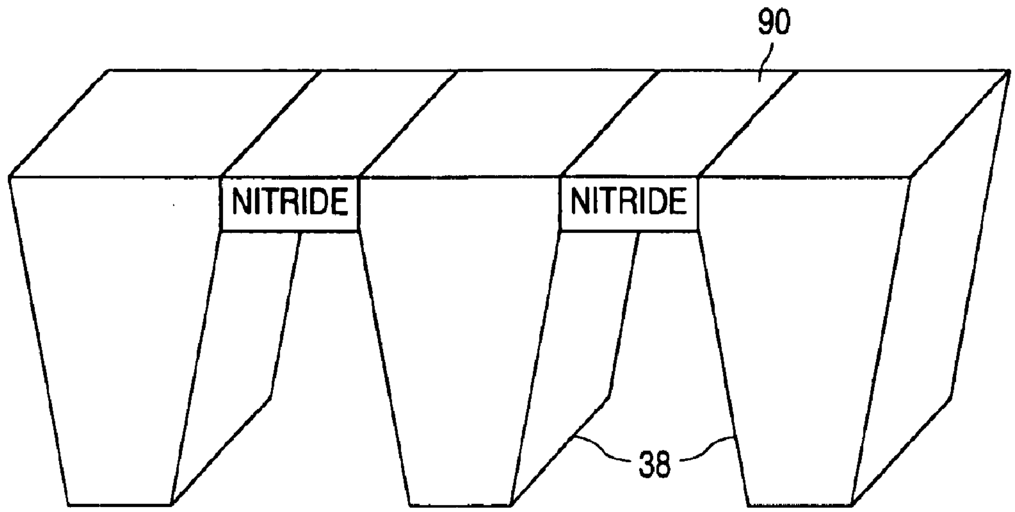
Figure 6D:
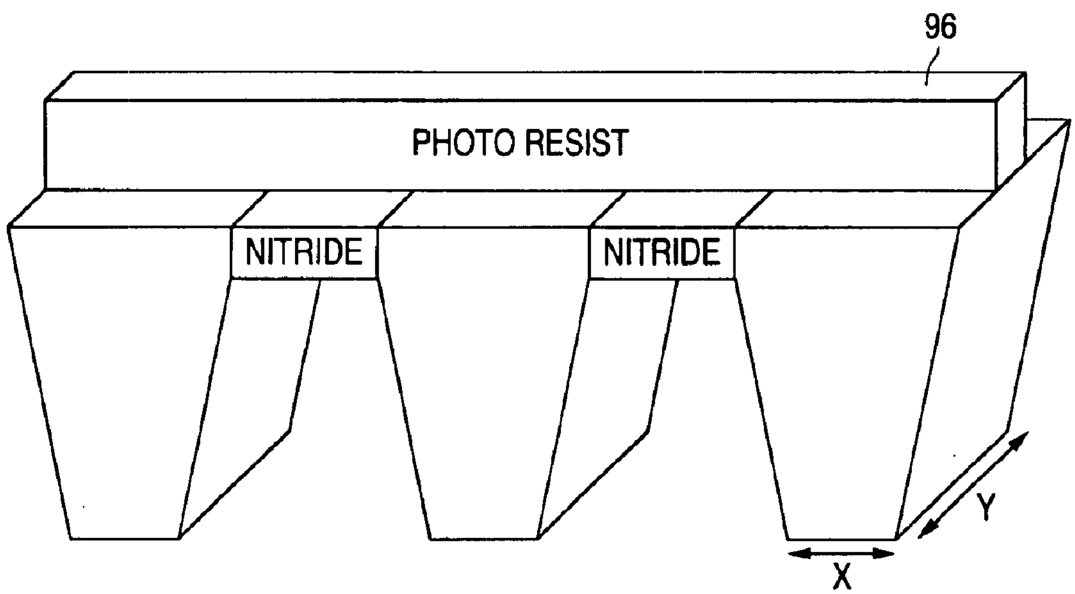
Figure 6E:
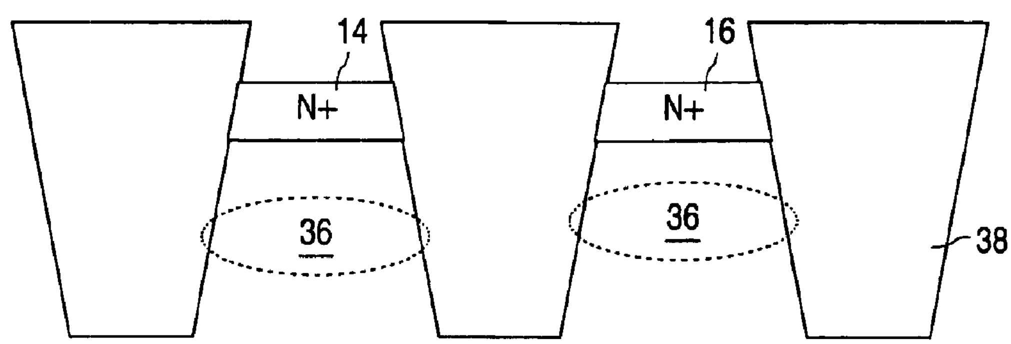

Referring to FIG. 6A, there is shown a first step in a first method of making the vertical NROM device 60 shown in FIG. 2. Similar to the method for making the vertical NROM device 40 shown in FIG. 1, the method uses single crystalline silicon substrate 12 of a P conductivity type. The substrate 12 has a top planar surface 32. A plurality of strips of silicon nitride 90 are deposited. The strips of silicon nitride 90 are spaced apart from one another and are approximately 1,000 angstroms in thickness to define the to be formed first and second regions 14 and 16. The height of the silicon nitride strips 90 define the word line thickness or the thickness of the polysilicon 26 in the row direction. After the strips of silicon nitride 90 are deposited, a 2,000 angstrom silicon trench is etched into the substrate 12 between adjacent silicon nitride strips 90. The result is shown in FIG. 6B. The trenches 38 are then filled with HDP silicon dioxide. The resultant structure is then CMP polished to remove the silicon dioxide until it is level with the top level of the silicon nitride layer 90. The resultant structure is shown in FIG. 6C. Strips of spaced apart photo resists 96 are then formed across in the Y direction of the structure. The regions below the photo resists 96 which are covered by the photo resists are the isolated regions between adjacent rows of vertical NROM cells. The resultant structure is shown in FIG. 6D. The region that is exposed and is not covered by the photo resist 96 are then subject to a dry nitride etch removing the silicon nitride 90. An implant of N+ species is made forming the first and second regions 14 and 16 in the active region area. An optional $V_{TH}$ implant can also be made in the region 36 which is between adjacent pair of trenches 38. The optional $V_{TH}$ implant in the regions 36 serve to control the threshold voltage of the transistor that is defined by the first region 14 and the second region 16 and the channel 18, which connects the first region 14 to the second region 16 and runs along the perimeter of each trench 38. The resultant structure is shown in FIG. 6E.

With the photo resist 96 still in place, the structure is subject to an oxide dry etch to remove the silicon dioxide from the trenches 38 that are exposed. The photo resist 96 is then removed. The resultant structure is shown in FIG. 6F.

Figure 6F:
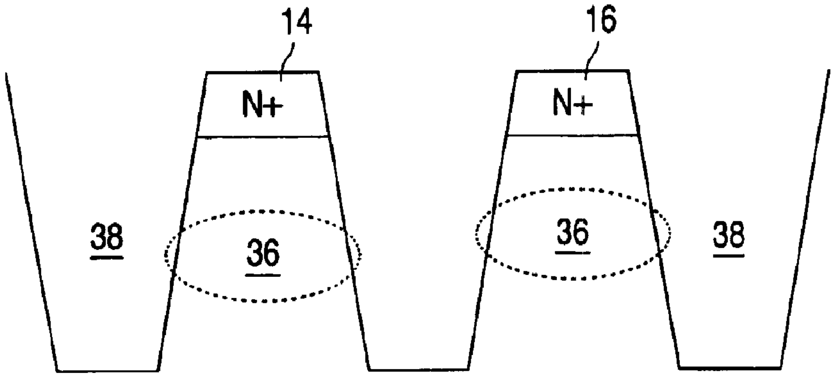
Figure 6G:
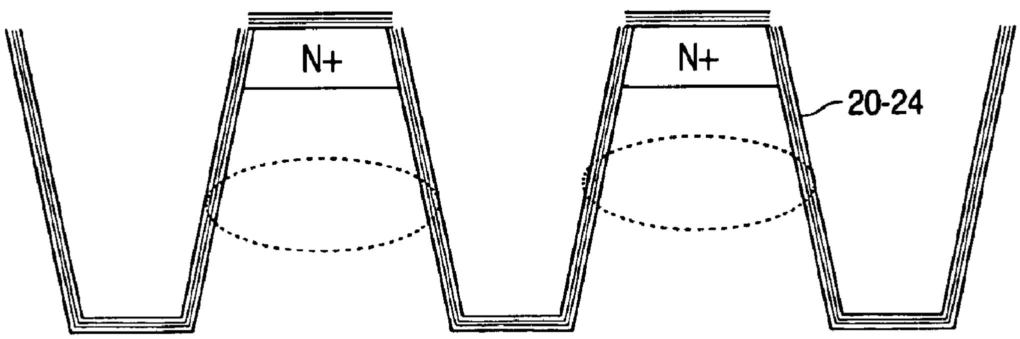

The insulating and dielectric layers of ONO 20–24 are then deposited on the structure shown in FIG. 6F. As a result, the ONO layers 20–24 run along the row direction of the structure and form continuously from one cell to an adjacent cell. The resultant structure is shown in FIG. 6G.

Figure 6H:
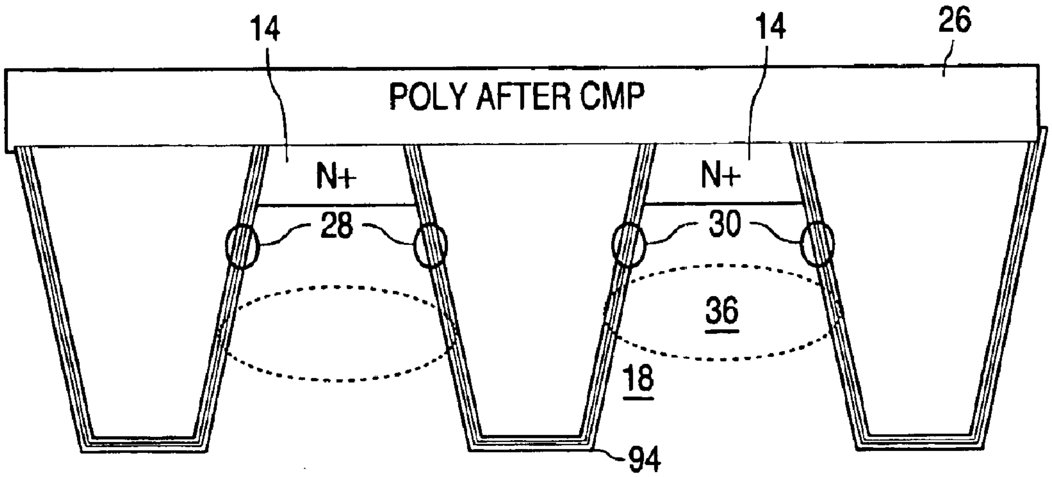

Polysilicon 26 then fills the exposed trenches 38 and form continuously in the row direction. After polysilicon 26 is deposited, the polysilicon 26 is CMP polished to a level which is to the top level of the adjacent silicon nitride 90 over the isolation region. The resultant structure is shown in FIG. 6H.

Figure 6I:
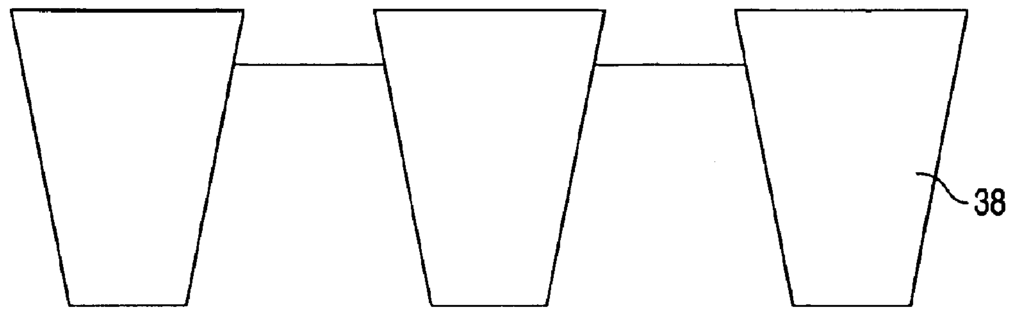

The structure is then subject to a dry silicon nitride etch. As a result, only that portion of the structure which has silicon nitride which is over the isolation region has its silicon nitride removed. Thus, the cross-sectional view shown in FIG. 6I is of the area after the silicon nitride is etched and in the isolation region. The etch can be dry or wet, so long as the ONO layers 20–24 underneath the covered polysilicon 26 are preserved.

Figure 6J:
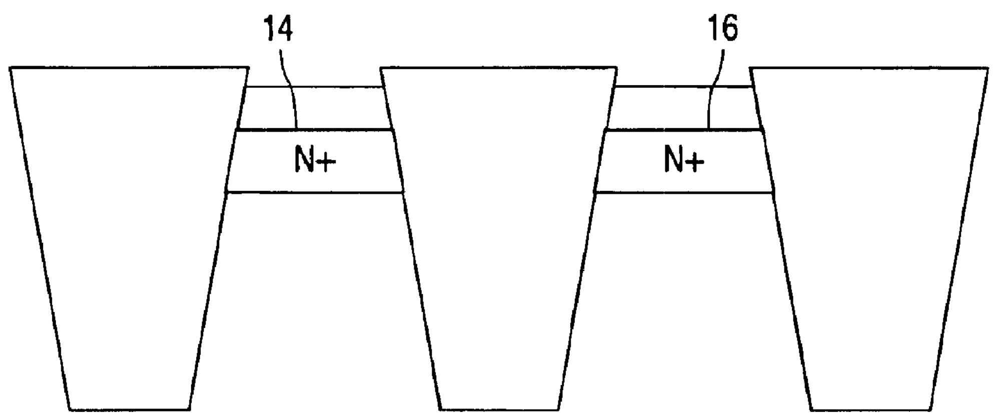

The structure is subject to an implant that connects the first and second regions 14 and 16 across the isolation region. Thus, as shown in FIG. 6J, the N+ implant connects the first region 14 from one row to another row across the isolation. Similarly, the implant connects the second region 16 from one row to an adjacent row. The trapping regions 28 and 30 in the active NROM cells are shown in FIG. 6H and are adjacent to the first and second regions 14 and 16 respectively. The first and second regions 14 and 16 respectively are adjacent to the top portion of the trench 38 and lie between adjacent trenches 38. The channel of each vertical NROM cell 60 that is between each first region 14 and second region 16 lies along the side wall of the trench 38, along the bottom portion 94, and along the side wall of the trench 38 again. Thus, the total length of the channel 18 is twice the length of the side wall of the trench plus the width of the bottom portion 94.

Figure 7A:
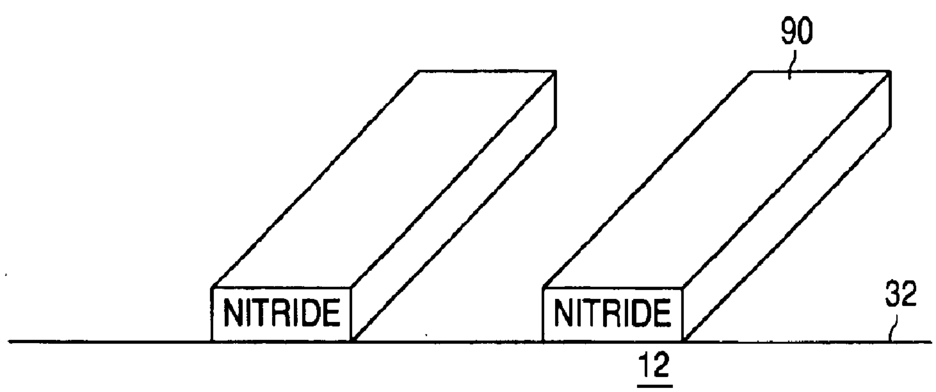
FIGS. 7A–7L are perspective and cross-sectional views of a second method of making the second embodiment of the vertical NROM cell and array of the present invention shown in FIG. 2.
Figure 7B:
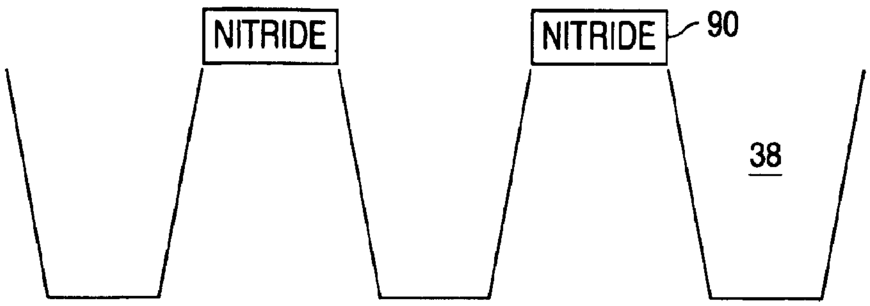
Figure 7C:
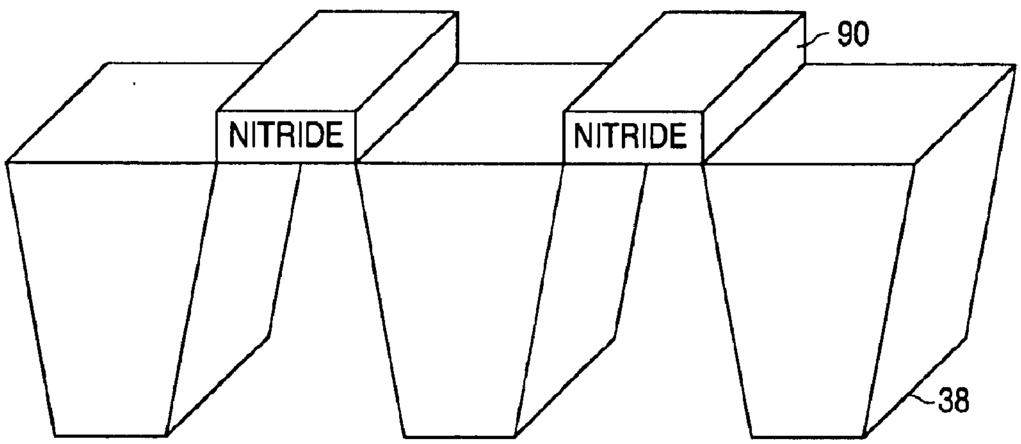
Figure 7D:
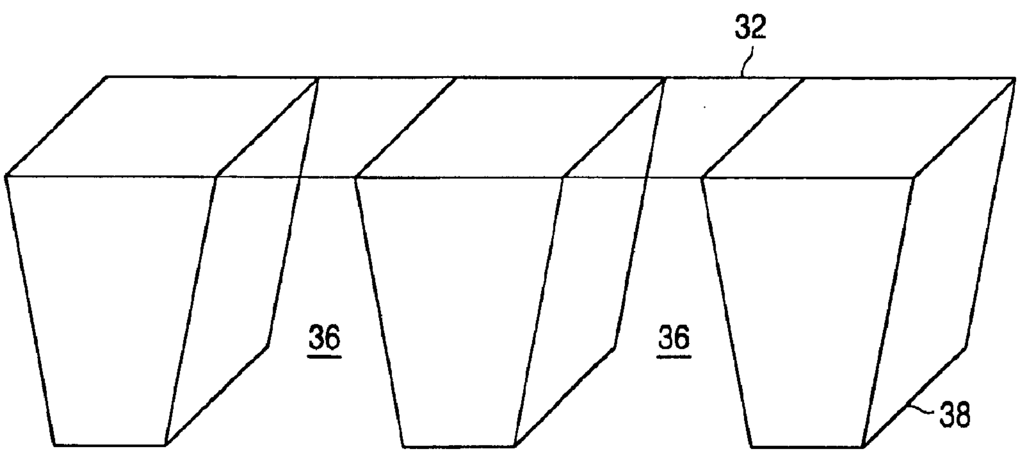
Figure 7E:
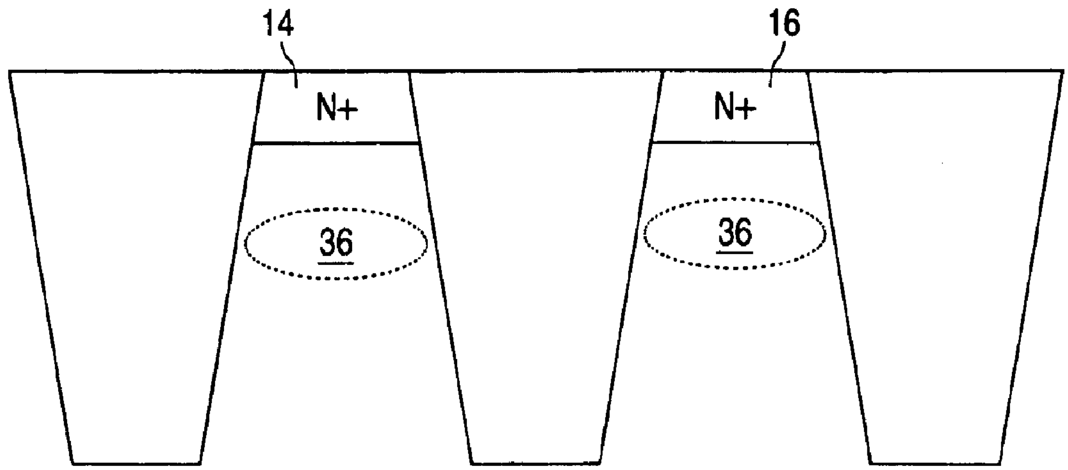

Referring to FIG. 7A, there is shown a first step in a second method of making the NROM device 60 shown in FIG. 2. In the first step, similar to the first step shown in FIG. 6A, nitride strips 90 that are spaced apart from one another are deposited on the top planar surface 32 of the silicon substrate 12. Thereafter, trenches are cut into the substrate 12 between regions of the spaced apart nitride 90 and the resultant structure is shown in FIG. 7B. The trenches are filled with silicon dioxide to the top surface level 32 of the substrate 12. The resultant structure is shown in FIG. 7C. The strips of nitride 90 are removed with the resultant structure shown in FIG. 7D. The regions 36 that are between adjacent pairs of trenches 38 are implanted with an N+ implant to form first and second regions 14 and 16. In addition, a $V_{TH}$ implant may also be made in the regions 36 to adjust the threshold of the transistor comprising the first region 14 and the second region 16. The resultant structure is shown in FIG. 7E.

Figure 7F:
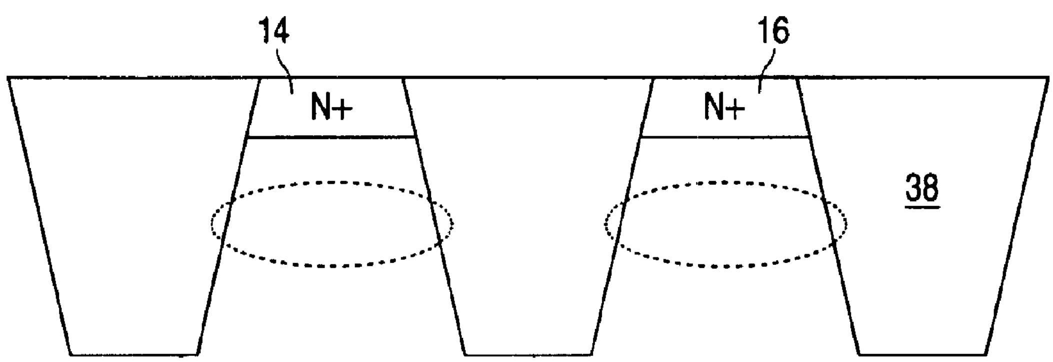
Figure 7G:
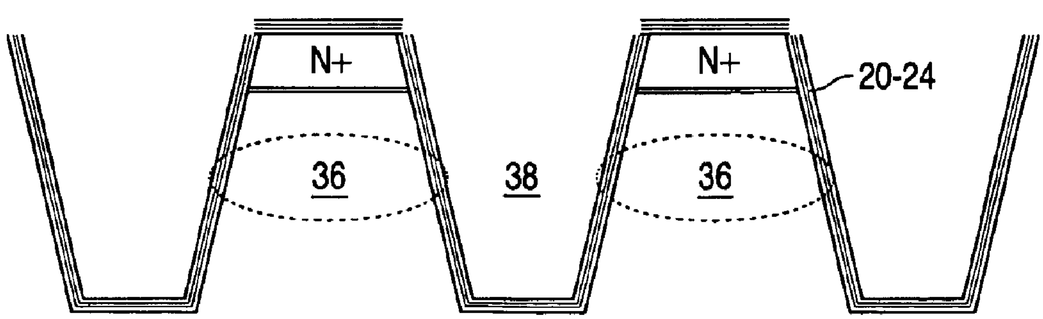
Figure 7H:
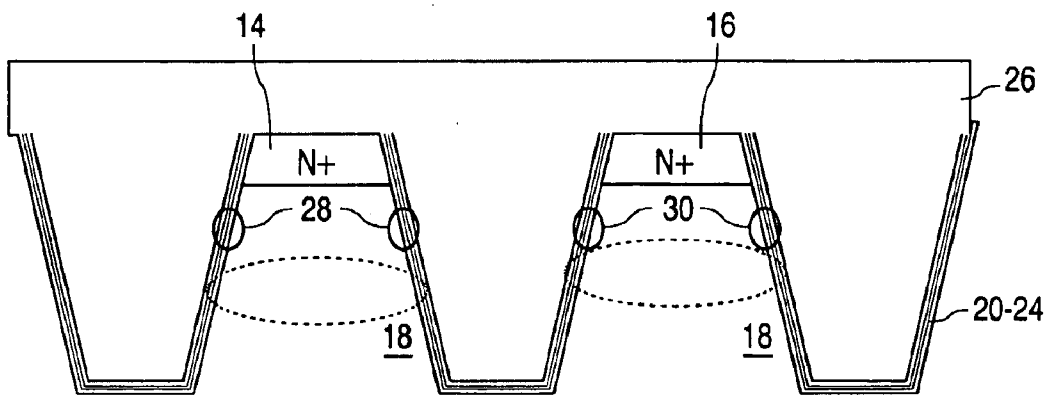
Figure 7I:
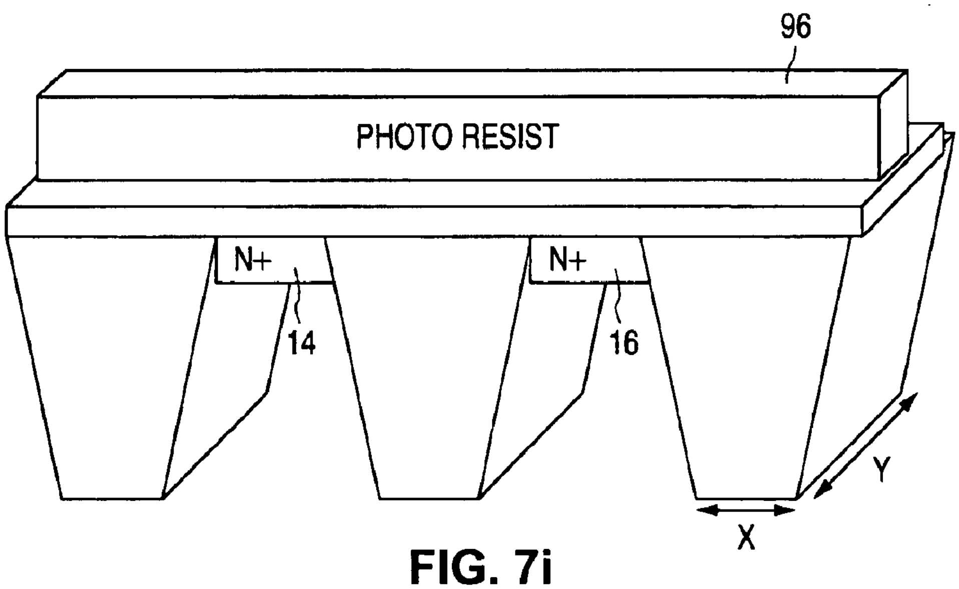
Figure 7J:
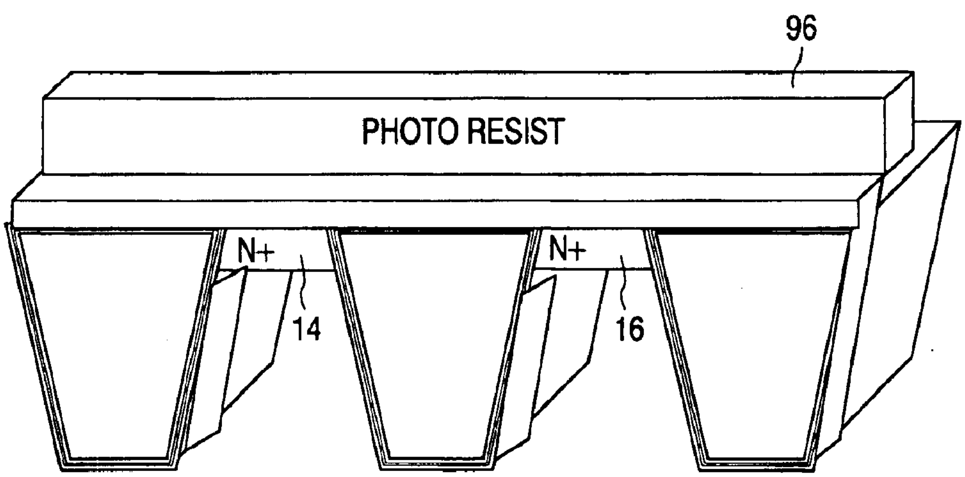
Figure 7K:
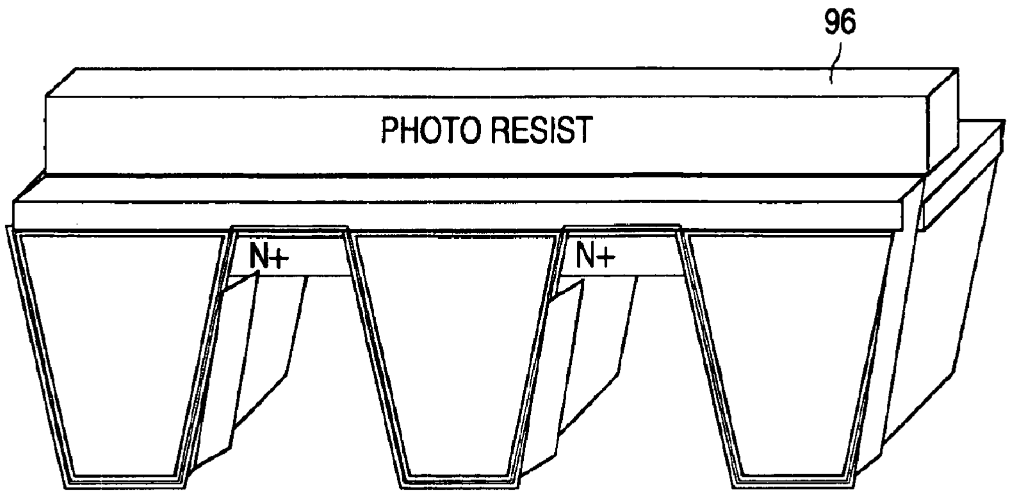
Figure 7L:
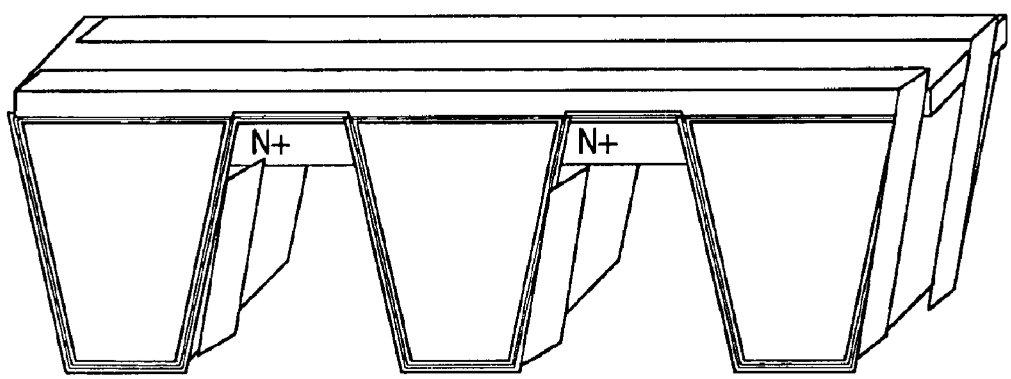

The silicon dioxide formed by the HDP process in the trenches 38 is then removed by a dry etch process. The resultant structure is shown in FIG. 7F. ONO layers 20–24 are deposited along the side walls of the trenches 38 and extend continuously from one NROM cell 60 to an adjacent cell in the same row are formed. The trenches are then filled with polysilicon 26, which extend in a continuous row direction connecting one NROM cell 60 with an adjacent NROM cell 60 in the same row. The resultant structure is shown in FIG. 7H. Spaced apart photo resist strips 96 are then formed in the Y direction. Each photo resist strip 96 covers an active portion comprising of active cells. The exposed region, i.e., areas not covered by the photo resist 96, are then etched. The polysilicon in those areas are then removed completely from the trenches 38. The resultant structure is shown in FIG. 7J. The trenches are then filled with an insulating material such as silicon dioxide to form an isolation region between adjacent rows of vertical NROM cells 60. The resultant structure is shown in FIG. 7K. Thereafter, the photo resist strips 96 are removed and then resultant structure is shown in FIG. 7L.

Figure 8A:
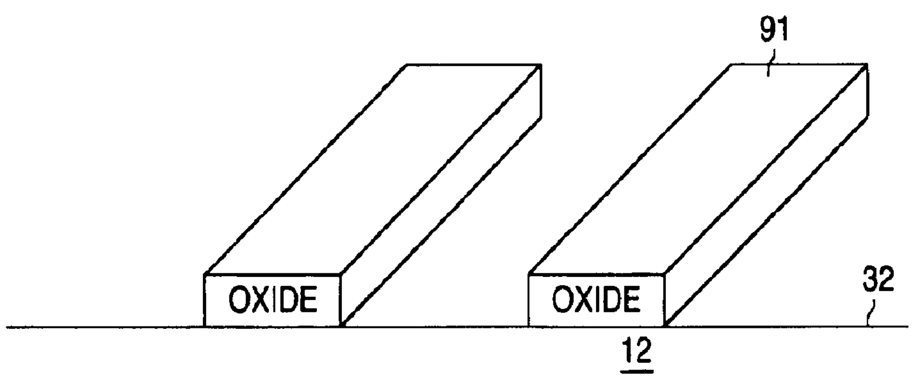
Figure 8B:
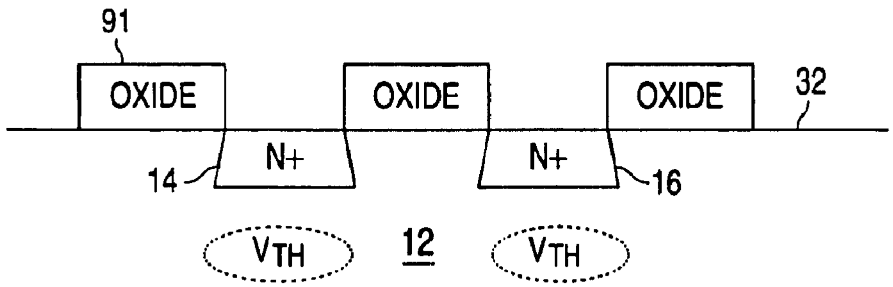
Figure 8C:
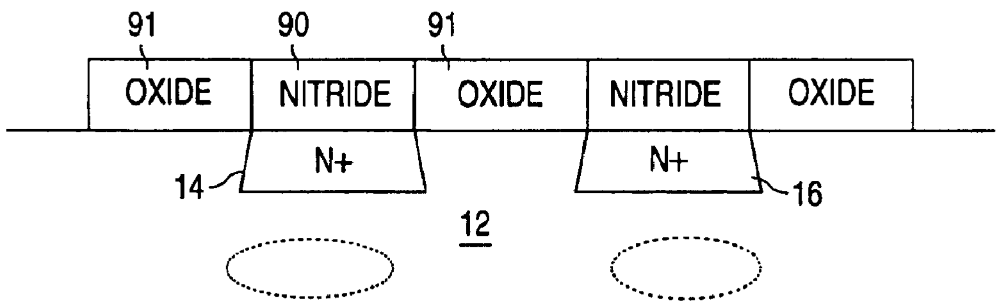
Figure 8D:
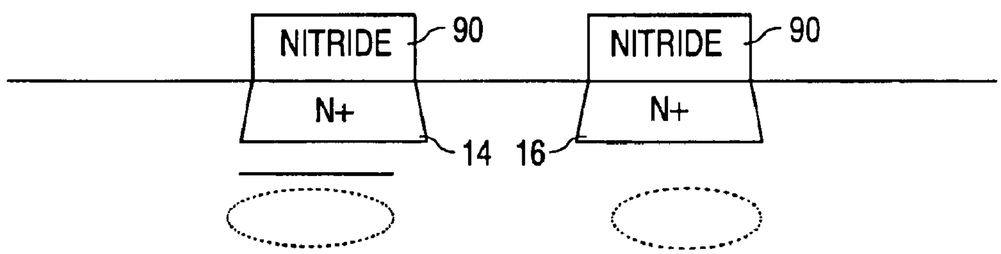
Figure 8E:
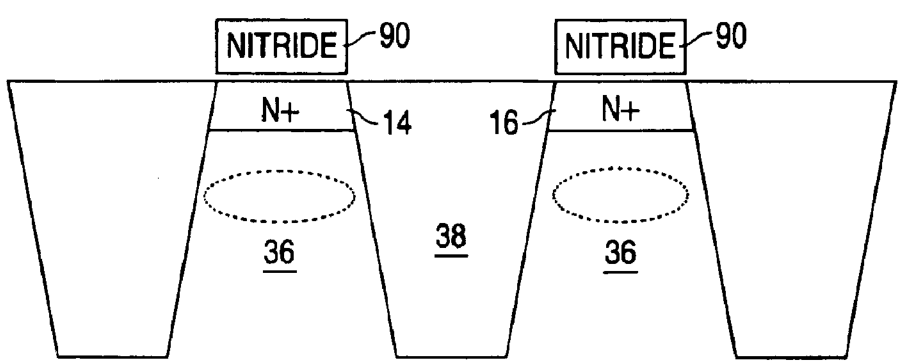

Referring to FIG. 8A, there is shown the first step in yet another method of making the vertical NROM device 60 shown in FIG. 2. In the first step, spaced apart strips 91 of silicon dioxide are deposited on the top surface 32 of the silicon substrate 12. The oxide strips 91 are spaced apart sufficiently so that the region therebetween will form the region of the first and second implant 14 and 16 respectively. With the oxide strips 91 as a mask, an implant step is made forming the first and second regions 14 and 16 and with the optional implant to adjust the $V_{TH}$ of the vertical NROM cell 60. The resultant structure is shown in FIG. 8B. The gaps between each silicon dioxide 91 is filled with silicon nitride 90. This can be done, for example, by depositing silicon nitride over the structure and then anisotropically etching silicon nitride with the silicon dioxide 91 as the etch stop. As a result, the silicon nitride then "covers" the first and second regions 14 and 16 respectively. The resultant structure is shown in FIG. 8C. Thereafter, the strips of silicon dioxide 91 are removed. The resultant structure is shown in FIG. 8D. With the silicon nitride as a mask, trenches 38 are cut into the silicon substrate 12. The resultant structure is shown in FIG. 8E.

Figure 8F:
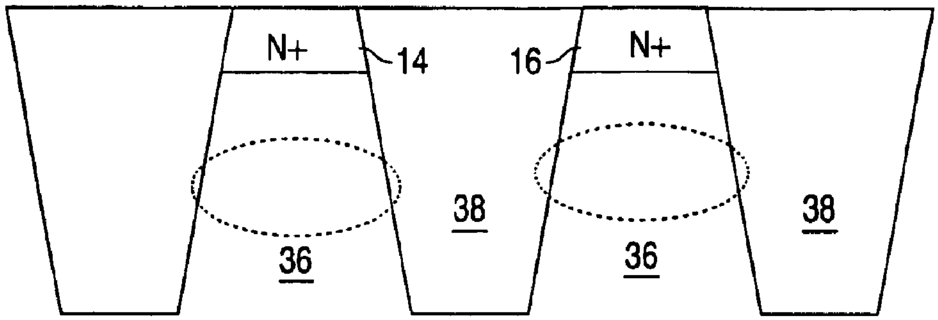
Figure 8G:
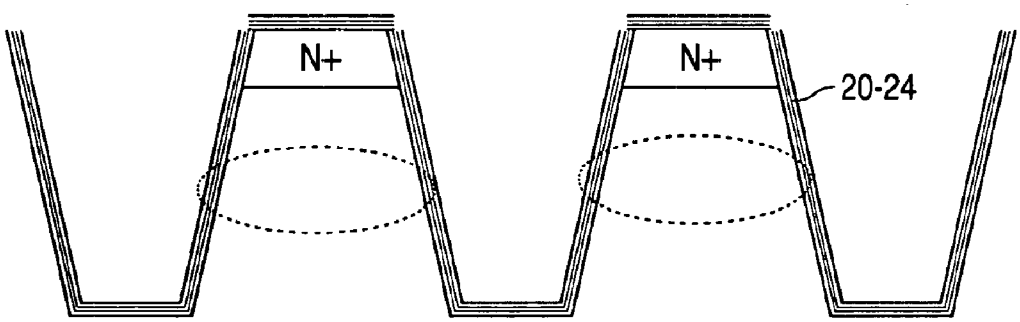
Figure 8H:
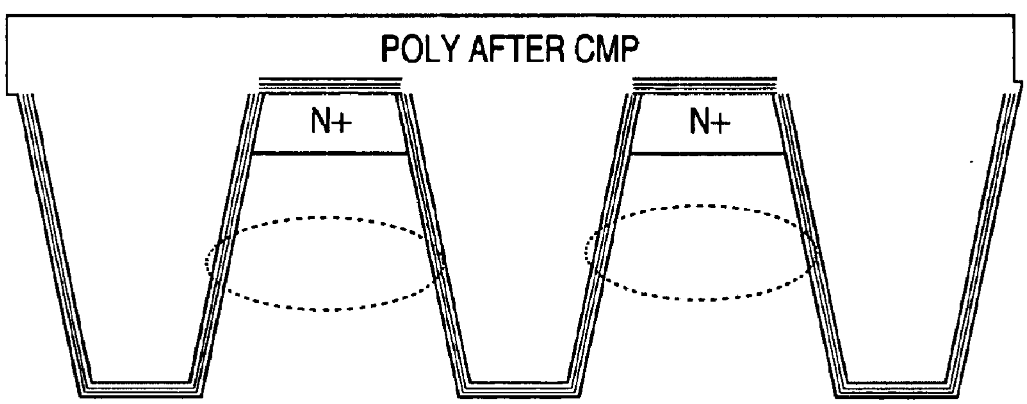
Figure 8I:
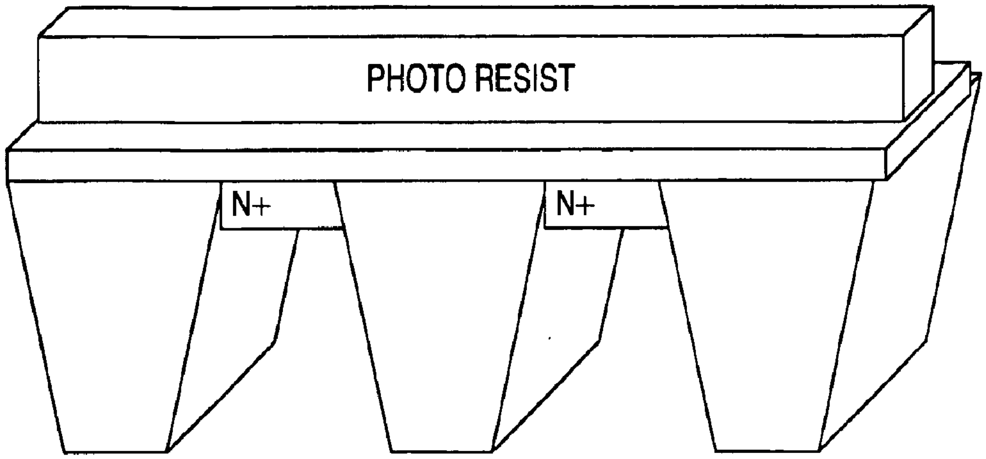
Figure 8J:
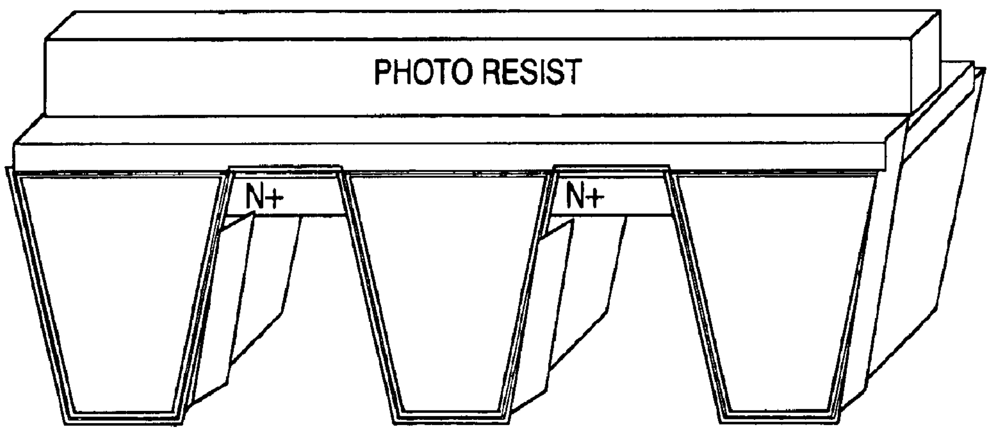
Figure 8K:
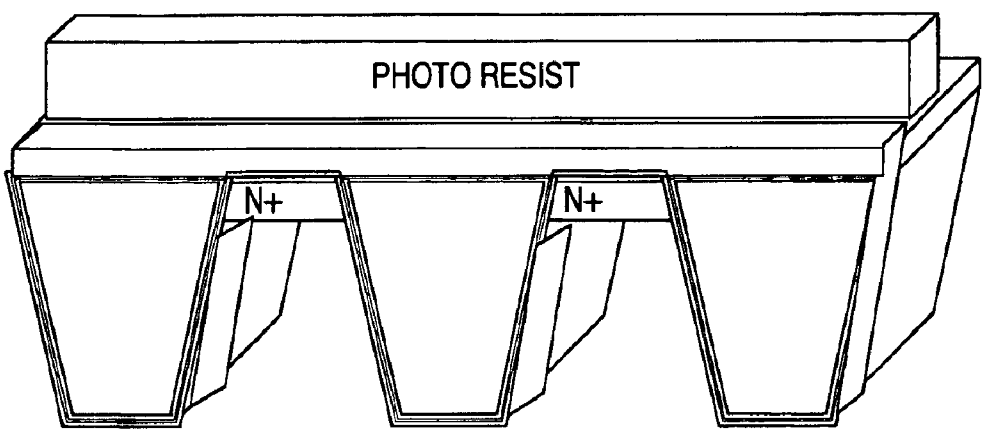
Figure 8I:
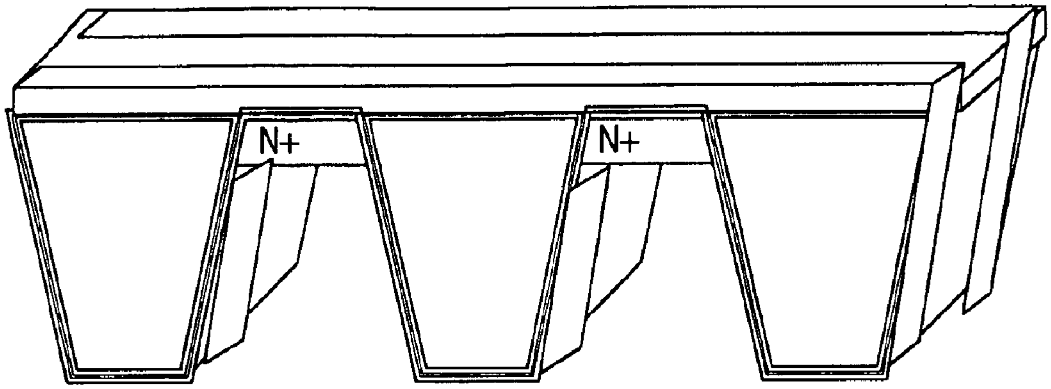

Thereafter, the nitride strips 90 are removed. The resultant structure is shown in FIG. 8F.

Finally, FIGS. 8G–8L show the subsequent steps of processing. These steps are identical to the steps shown and described in FIGS. 7G–7L.

Figure 9A:
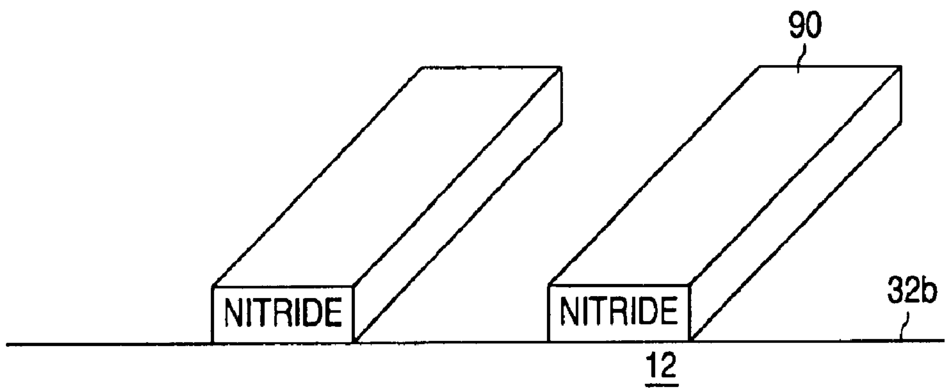
FIGS. 9A–9M are perspective and cross-sectional views of a first method of making the third embodiment of the vertical NROM cell and array of the present invention shown in FIG. 3A.
Figure 9B:
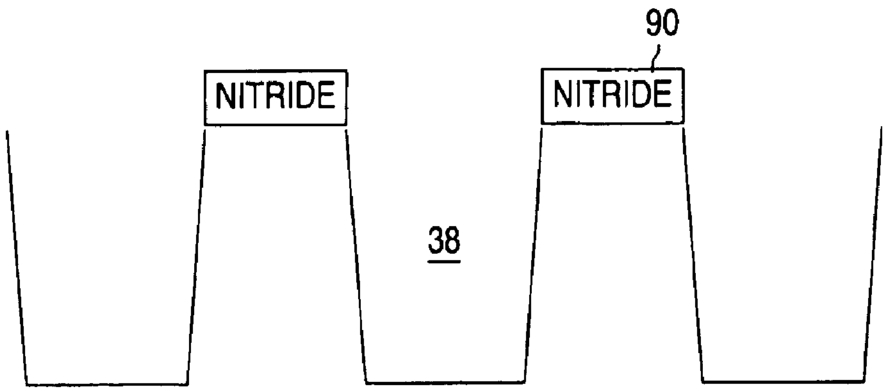
Figure 9C:
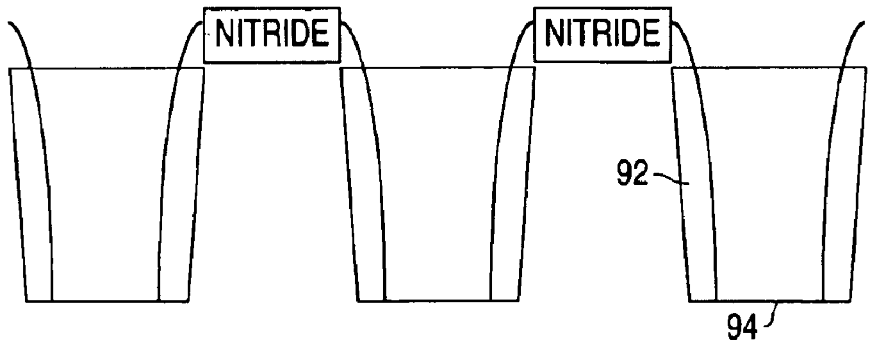
Figure 9D:
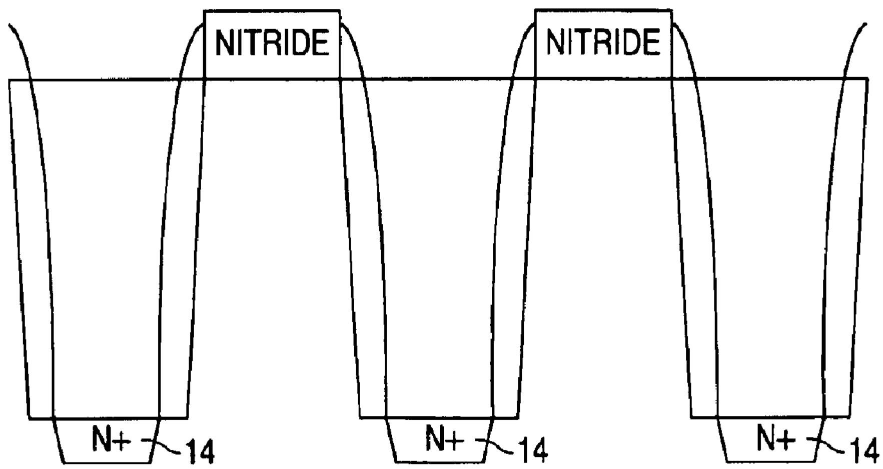

Referring to FIG. 9A, there is shown a first step in a first method of making the vertical NROM device 80A shown in FIG. 3A. Initially, spaced apart strips of silicon nitride 90 of approximately 500 angstrom width are deposited on a top surface 32B of the silicon substrate 12. This is followed by the cutting of the silicon substrate 12 to form trenches 38 in the spaces between strips of silicon nitride 90. An optional trench side wall implant can be made. The resultant structure is shown in FIG. 9B. Each trench, similar to the trenches discussed heretofore, have side walls, a top portion and a bottom portion 94. Oxide spacers 92 are formed along the side walls of the trench 38. The result of the formation of the oxide spacers 92 is to "constrict" the width of the bottom portion 94. N+ implants are made to form the first regions 14 at the bottom portion 94 of each of the trenches 38. The first regions 14 extend vertically perpendicular to the cross-sectional of the view of the structure shown in FIG. 9D.

Figure 9E:
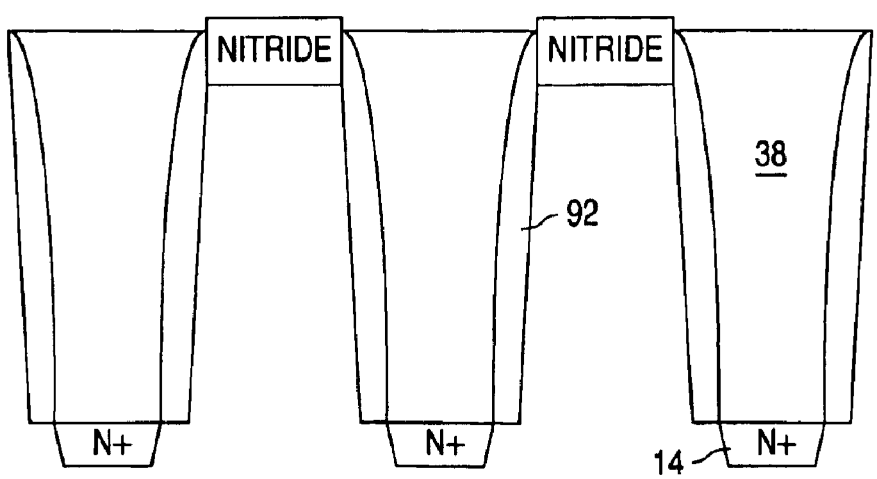

High density plasma or HDP is used to form silicon dioxide to fill the trenches 38. CMP polishing is applied to the surface of the structure. The result is that shown in FIG. 9E.

Figure 9F:
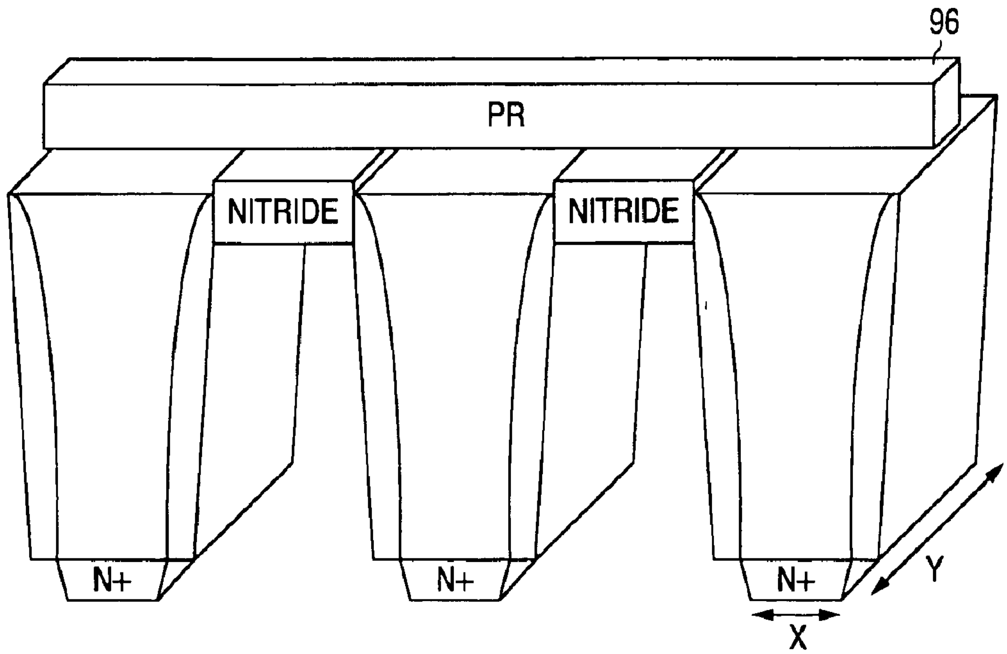
Figure 9G:
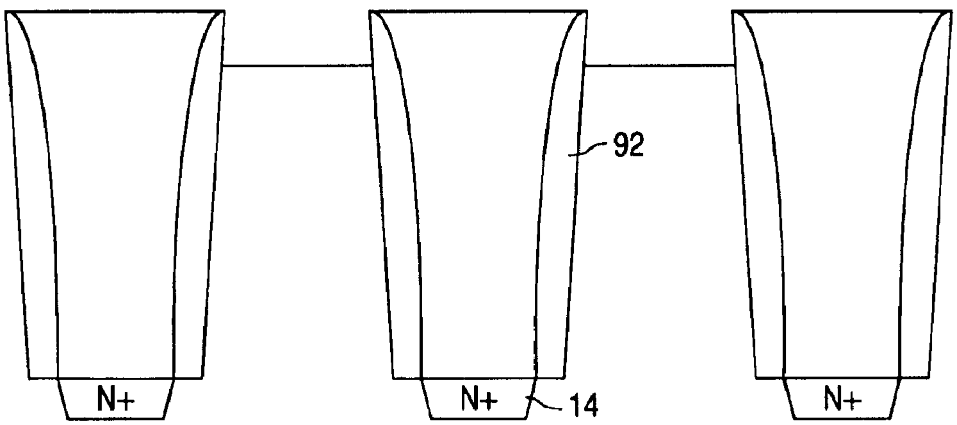

Spaced apart strips 96 of photo resist are applied in the Y direction of the structure. The photo resist 96 protects those regions of the trenches 38 which would eventually become the isolation region between adjacent rows of vertical NROM cells 80A. The resultant structure is shown in FIG. 9F. Where the photo resist 96 does not cover the underlying structure, the nitride 90 is exposed and is dry etched. A cross-sectional view of the "active" area is shown in FIG. 9G with the silicon nitride 90 removed. Thus far, all of the steps described are similar to the steps shown and described in FIGS. 4A–4G in the formation of the vertical NROM device 40.

Figure 9H:
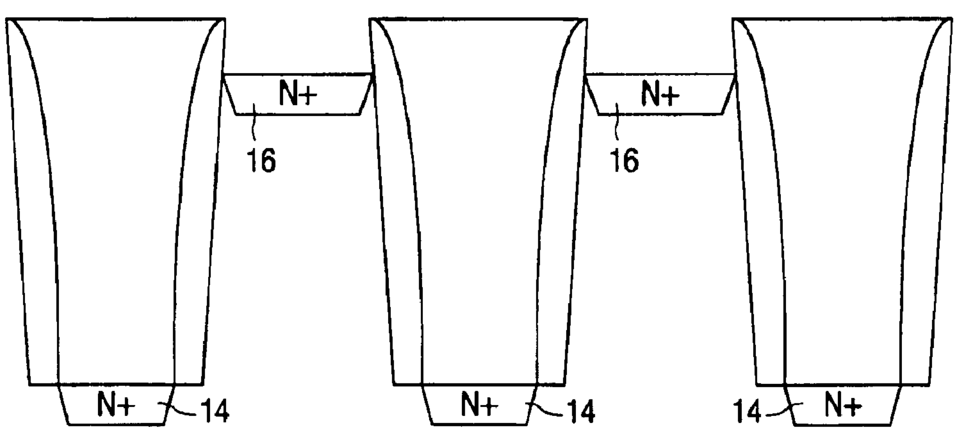

The next step, N+ implants are made to the structure. This forms the second region 16 which are in the spaced regions between adjacent trenches 38. The resultant structure is shown in FIG. 9H of the cross-sectional view of the "active" area. Because the strips of photo resist 96 cover the isolation area, the second region 16 are discontinuous in that they do not run continuously parallel to the first regions 14. The resultant structure is shown in FIG. 9H.

Figure 9I:
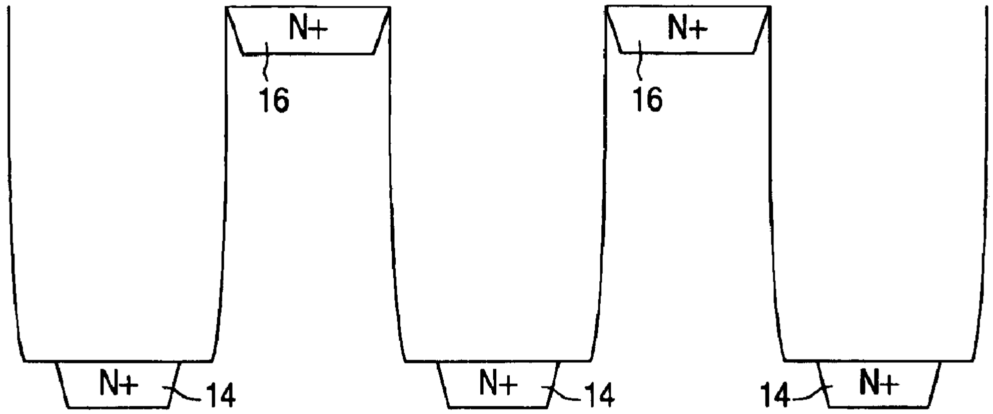
Figure 9J:
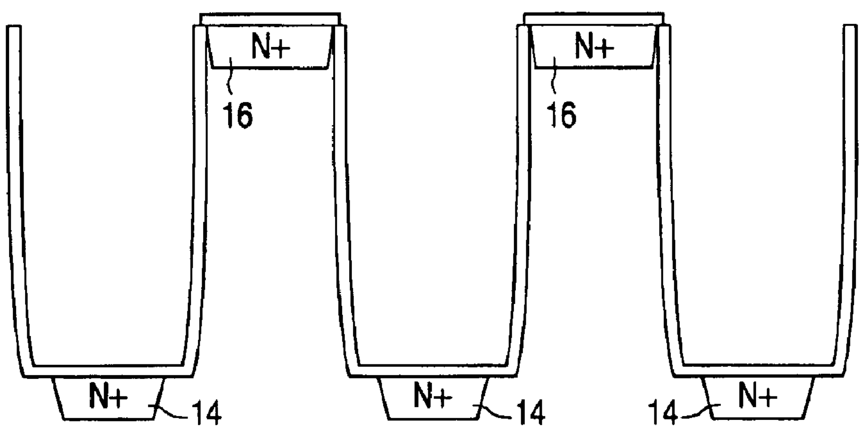

The silicon dioxide from the regions not covered by the photo resist strips 96 are then removed. The resultant structure is shown in FIG. 9I. The photo resist strips 96 are then removed. The composite layer of ONO 20–24 is then applied. The ONO layer 20–24 is deposited in a continuous strip across a plurality of cells and trenches 38 in a row direction. The resultant structure is shown in FIG. 9J of a cross-section view through the active area.

Figure 9K:
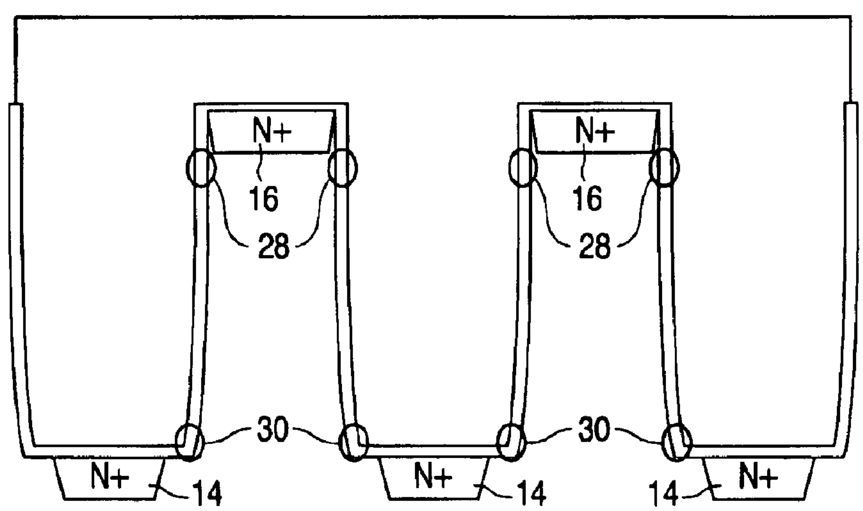
Figure 9L:
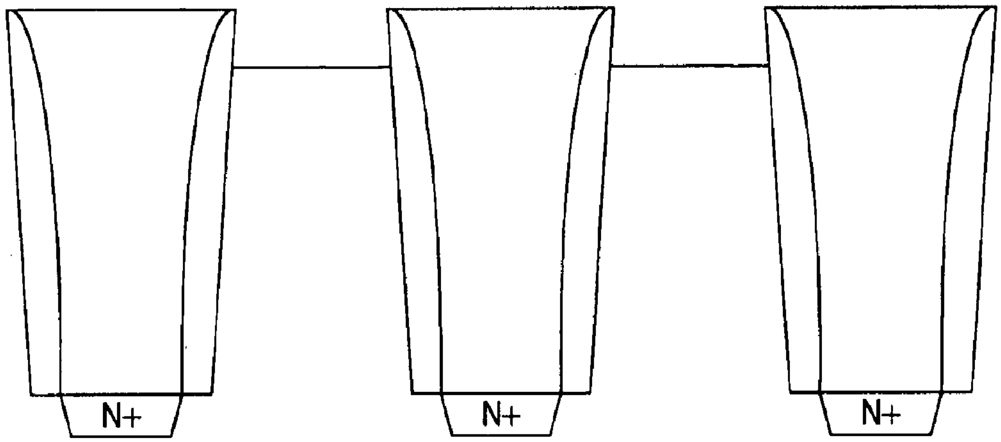
Figure 9M:
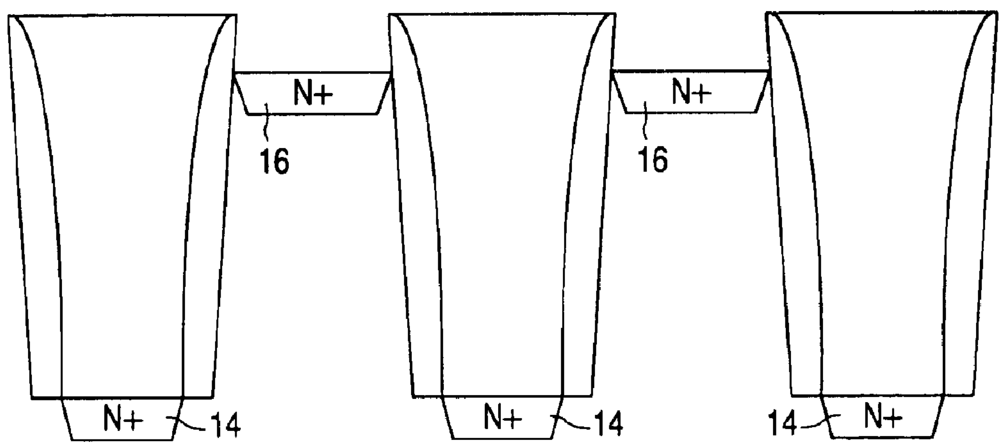

Polysilicon 26 is deposited within the exposed trenches 38. The polysilicon 26 is deposited above the top portion of the trench so that it is continuous in a row direction. The polysilicon 26 is then CMP polished to the top level of the adjacent silicon nitride 90, which is over the "isolation" region. The silicon nitride 90 is then removed from the isolation region of the structure. A cross-sectional view of the isolation region is shown in FIG. 9L. Another implant of N+ species is made. This deposits the second region 16 in the isolation region, thereby connecting the second regions 16 of adjacent active rows of cells. A cross-sectional view of the resultant structure through the isolation region is shown in FIG. 9M. The cross-sectional view of the vertical NROM device 80A through the active region is shown in FIG. 9K. As can be seen, in this embodiment, the channel region consists of only the length of a side wall of a trench. The two regions to trap the charges 28 and 30 are at either extremes or ends of the side wall of each trench. As a result, a single trench may have four trapping regions, increasing the density of a vertical NROM cell 80A.

Figure 10A:
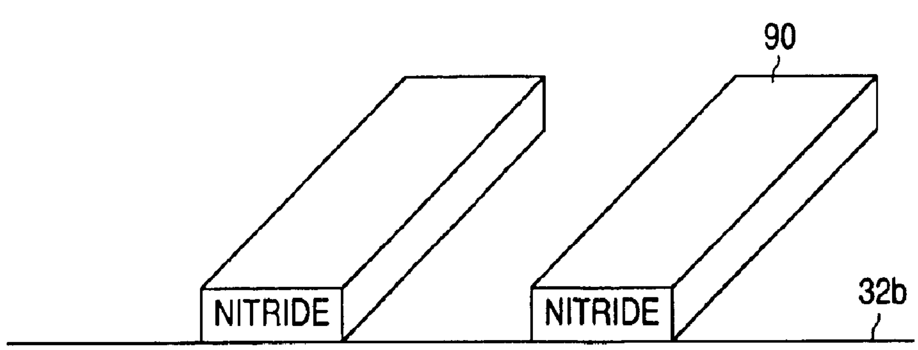
FIGS. 10A–10N are perspective and cross-sectional views of a second method of making the third embodiment of the vertical NROM cell and array of the present invention shown in FIG. 3A.
Figure 10B:
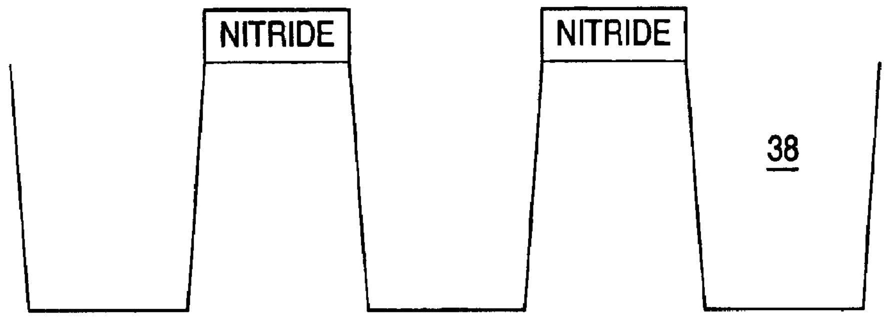
Figure 10C:
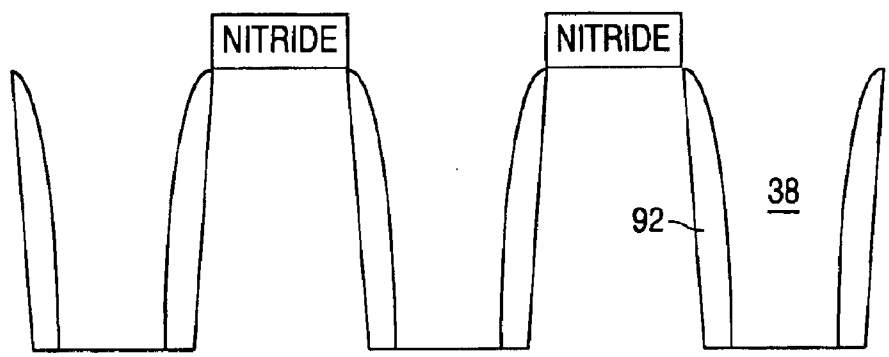
Figure 10D:
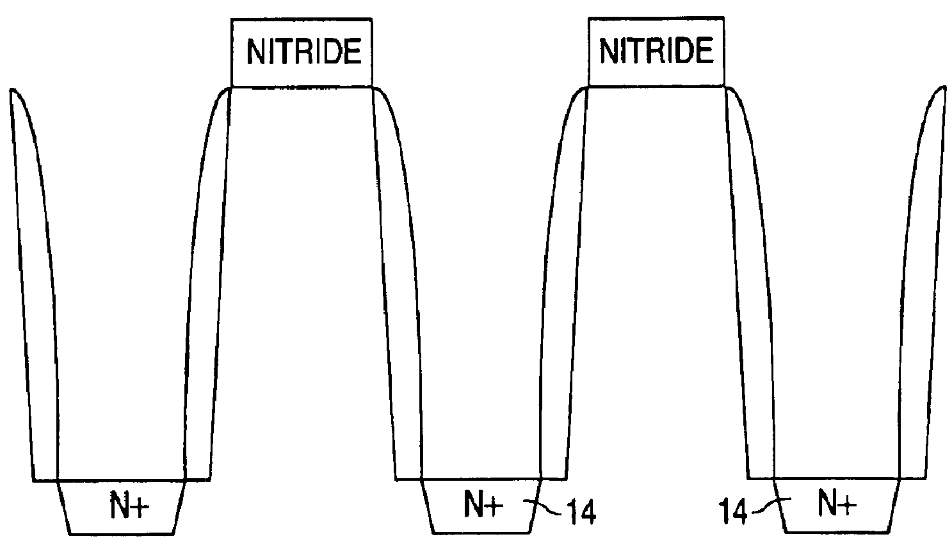
Figure 10E:
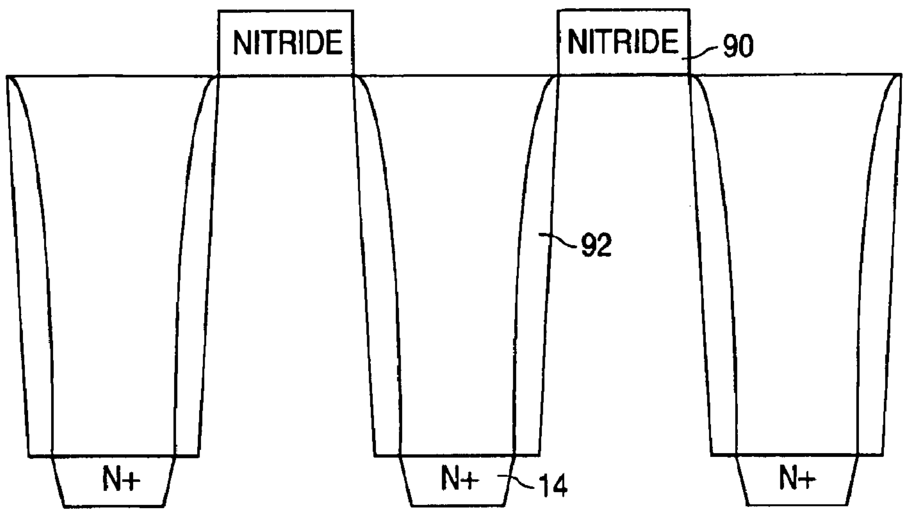

Referring to FIG. 10A, there is shown a first step in a second method of making the vertical NROM device 80A of the present invention. The steps shown in FIGS. 10A–10E are identical to the steps shown and described in FIGS. 9A–9E.

Figure 10F:
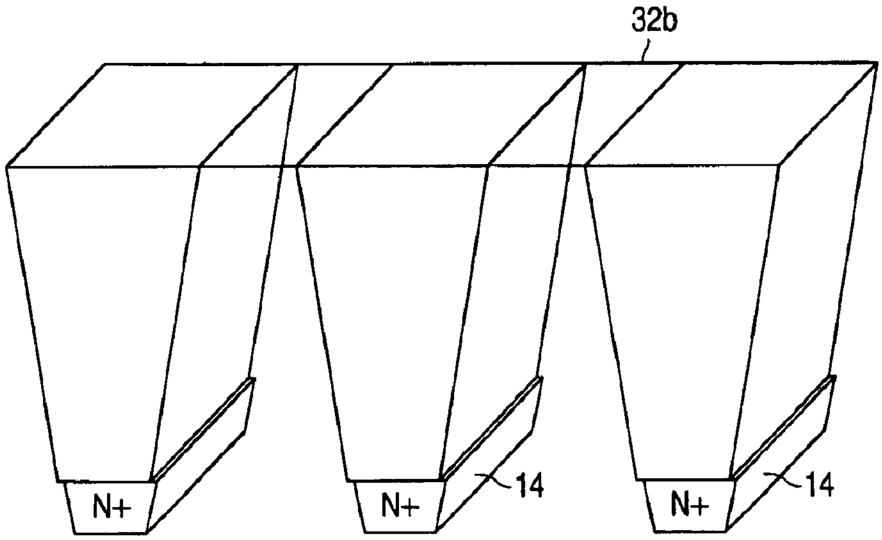
Figure 10G:
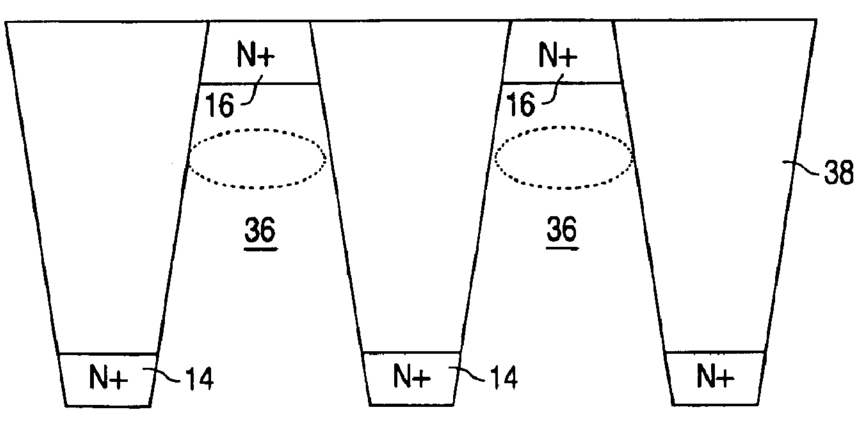

Thereafter, the silicon nitride strips 90 are removed. The resultant structure is shown in FIG. 10F. An N+ implant causes the formation of the second region 16 adjacent to the top portion of each of the trenches 38. In addition, similar to the embodiment described heretofore, an optional $V_{TH}$ implant in the spaces 36 between adjacent trenches 38 can also be made. The resultant cross-sectional view is shown in FIG. 10G. With this implant, the second regions 16 run continuously parallel to the first regions 14 and extend in a direction which is substantially perpendicular to the rows of NROM cells 80A shown in cross-sectional view in FIG. 10G.

Figure 10H:
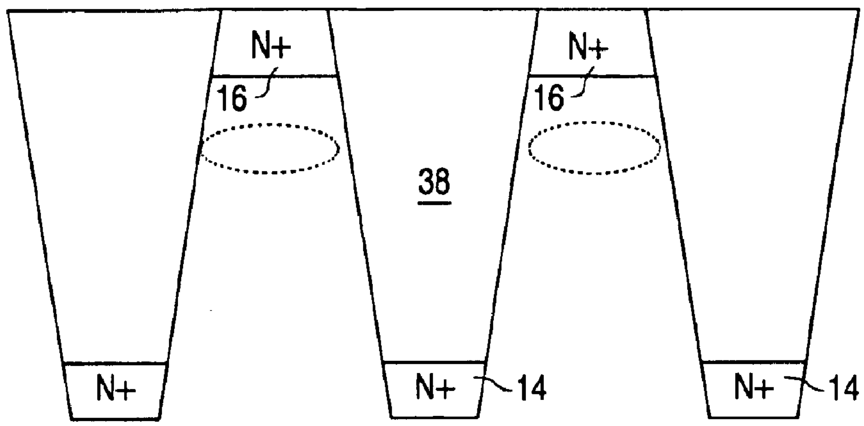

The silicon dioxide from the trenches 38 is then removed, either by dry or wet etch, as shown in FIG. 10H.

Figure 10I:
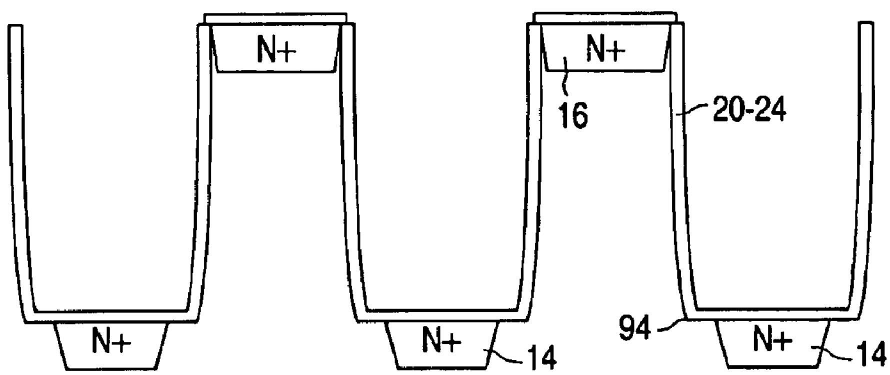

A composite layer of ONO 20–24 is then deposited within the trench and across the trench 38 as shown in FIG. 10I. The ONO layers 20–24 run along the entire length of the trenches 38, along the side wall and along the bottom portion thereof, as well as crossing into adjacent trenches 38. The resultant structure is shown in FIG. 10I.

Figure 10J:
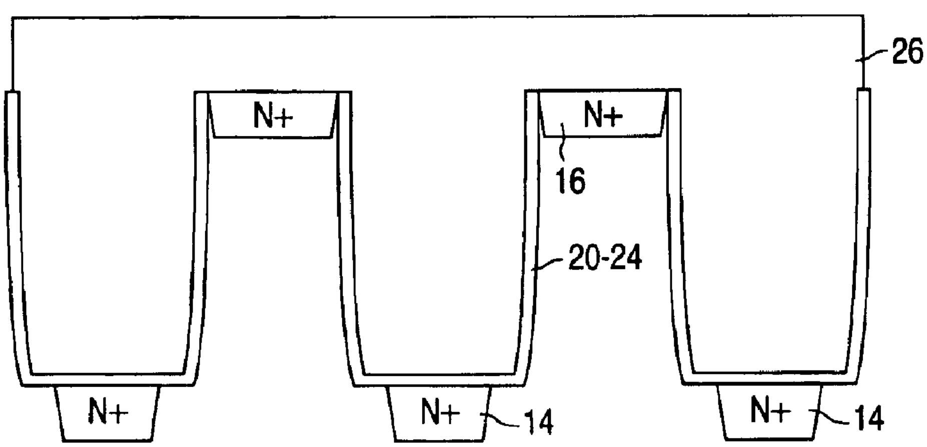

Polysilicon 26 is deposited into the trenches adjacent to the ONO layers 20–24. The polysilicon 26 is then CMP polished and the resultant structure is shown in FIG. 10J. The polysilicon 26 connects the gate of each NROM cell in the row direction.

Figure 10K:
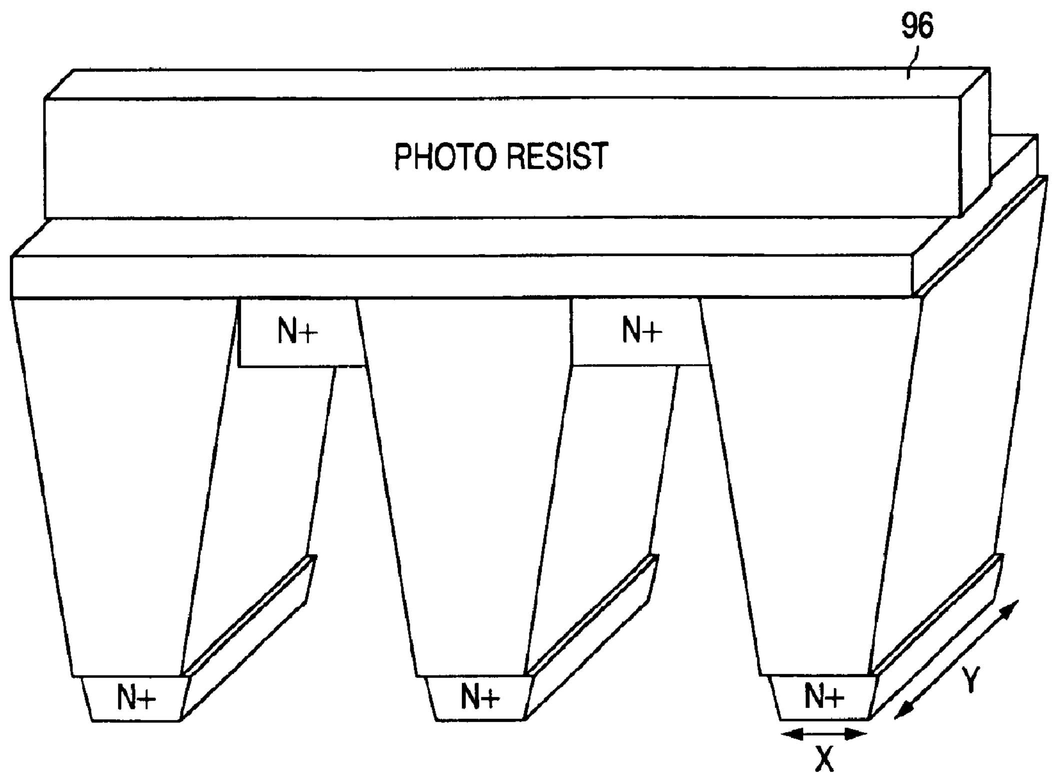
Figure 10L:
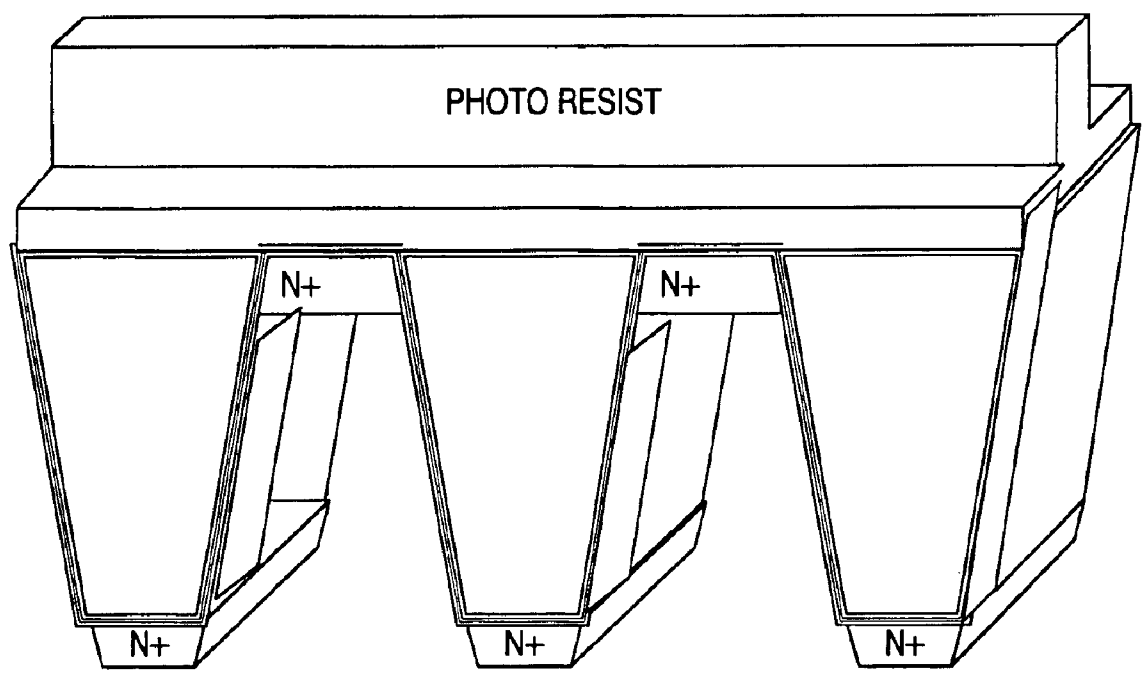
Figure 10M:
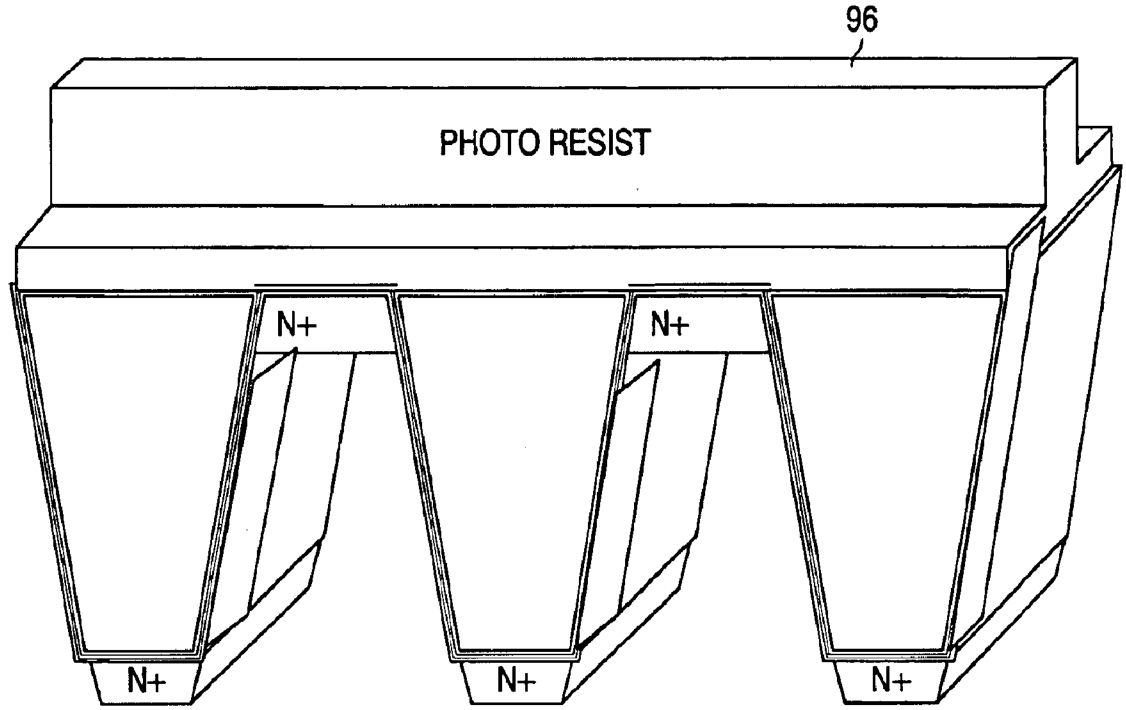
Figure 10N:
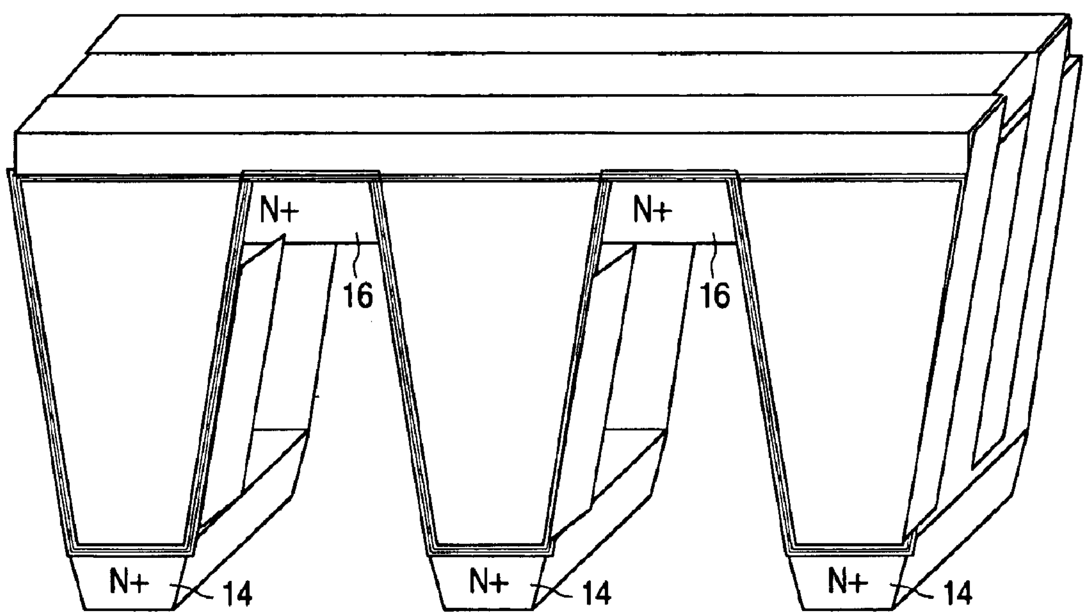

Strips of spaced apart photo resist 96 are then deposited along the Y direction of the structure on top of the top planar surface 32B. The resultant structure is shown in FIG. 10K. Each strip of photo resist 96 protects the "active" area. Where the photo resist 96 does not cover the polysilicon 26, the polysilicon is then anisotropically etched. The resultant structure is shown in FIG. 10L. The exposed trenches 38 in the regions where the polysilicon 26 have been removed are then filled with an insulating material such as silicon dioxide. The resultant structure is shown in FIG. 10M. Finally, the strips of photo resist 96 are then removed. The resultant structure is shown in FIG. 10N.

Figure 11A:
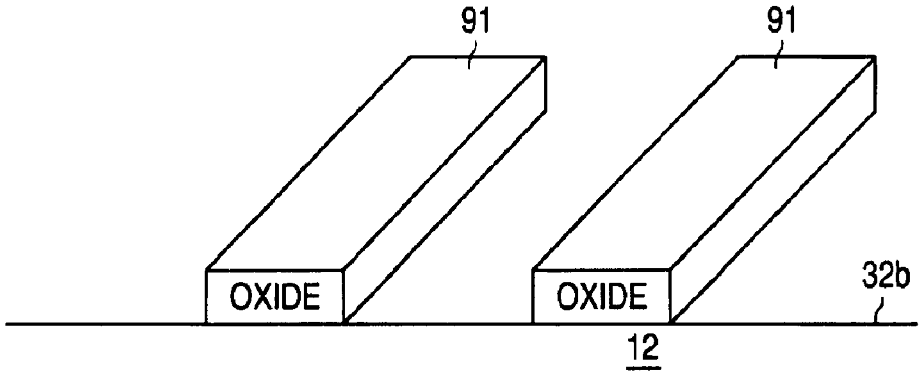
FIGS. 11A–11O are perspective and cross-sectional views of a third method of making the third embodiment of the vertical NROM cell and array of the present invention shown in FIG. 3A.
Figure 11B:
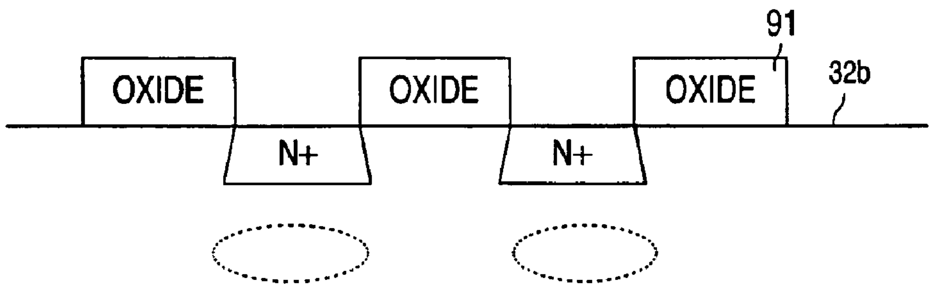
Figure 11C:
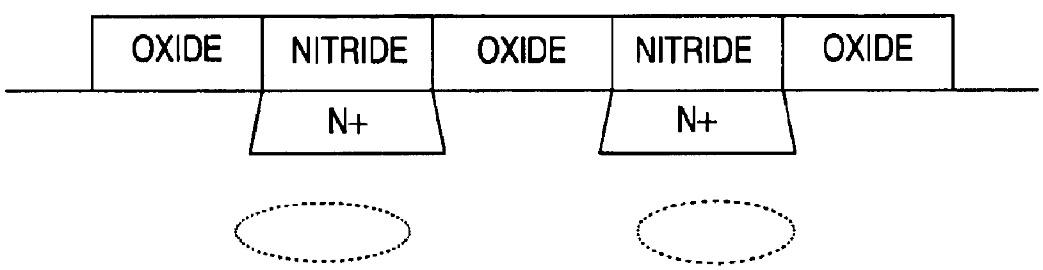
Figure 11D:
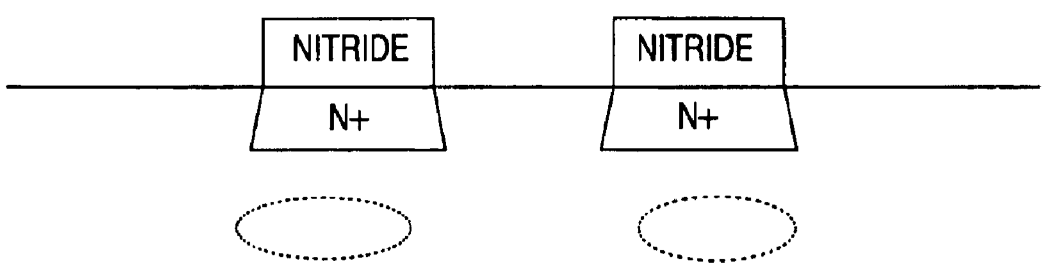
Figure 11E:
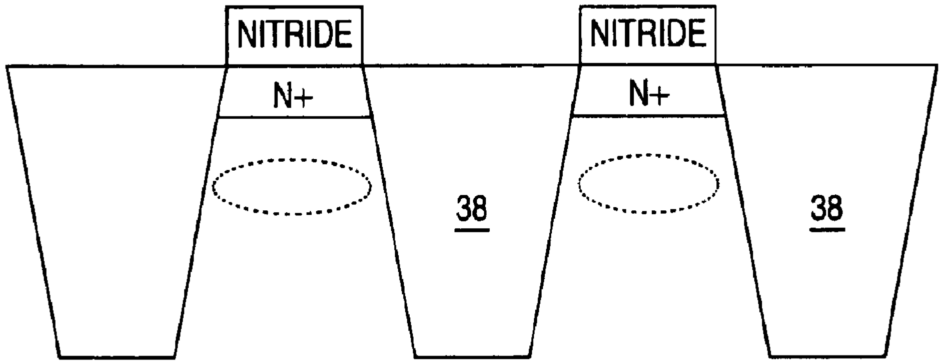

Referring to FIG. 11A, there is shown a first step in a third method of making the vertical NROM device 80A. In the first step, spaced apart strips of silicon dioxide 91 are deposited on the top plane of surface 32B of a silicon substrate 12. The oxide strips 91 are spaced apart sufficiently such that the spaced apart region would eventually form the second region 16. The steps shown in FIGS. 11A–11E are similar to the steps shown and described in FIGS. 8A–8E.

Figure 11F:
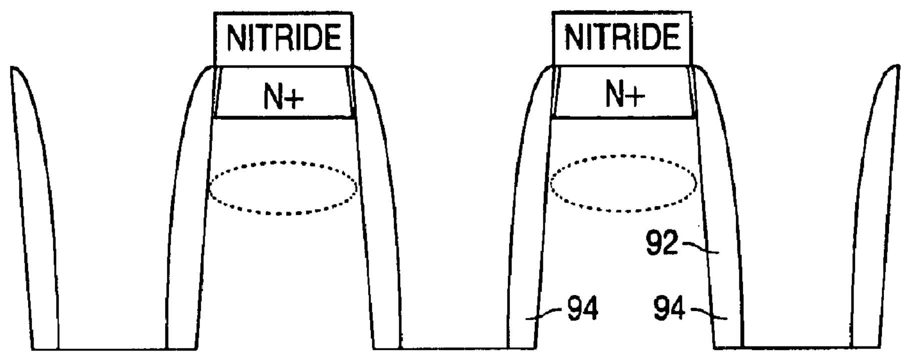

After the trenches 38 are formed, silicon dioxide spacers 92 are formed along the side walls of the trenches 38. As discussed previously, this narrows the width of the bottom portion 94 of the trenches 38. The resultant structure is shown in FIG. 11F.

Figure 11G:
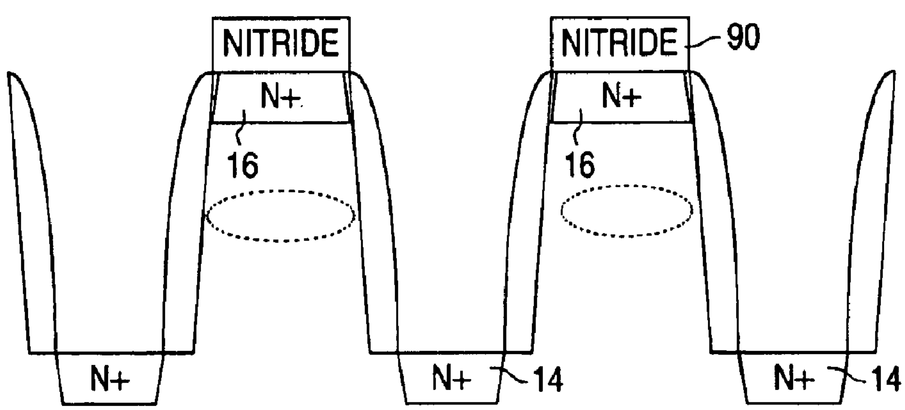
Figure 11H:
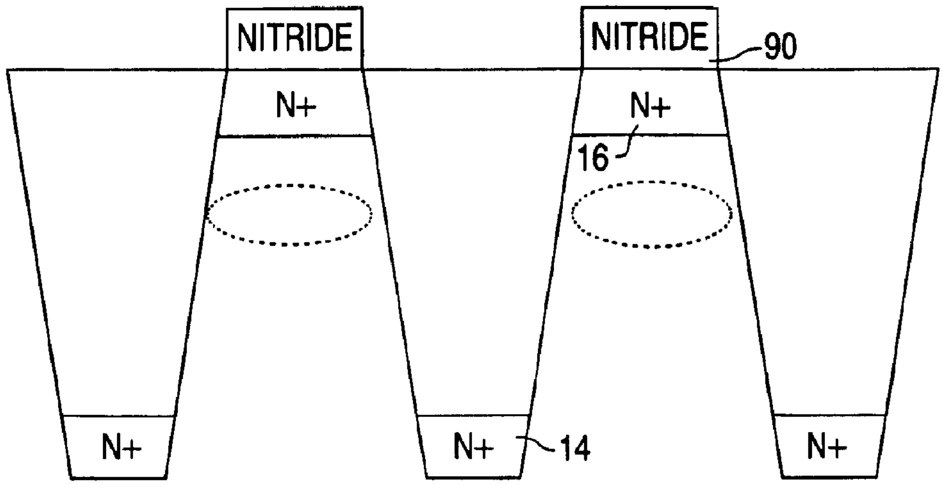
Figure 11I:
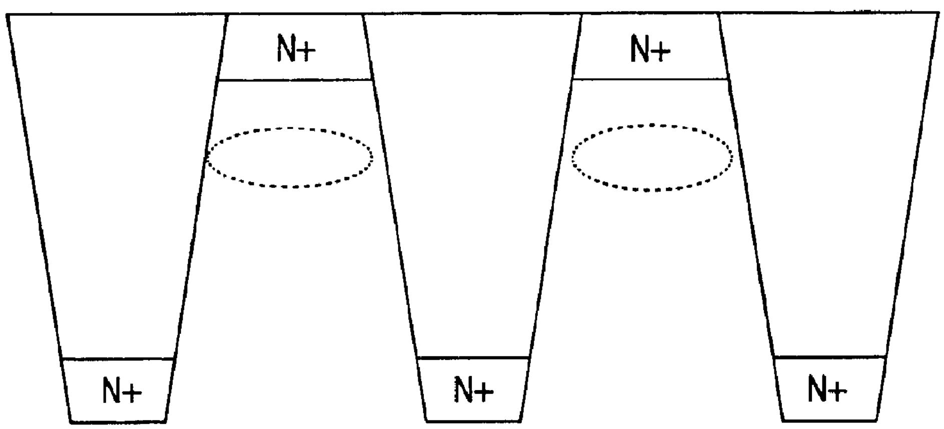
Figure 11J:
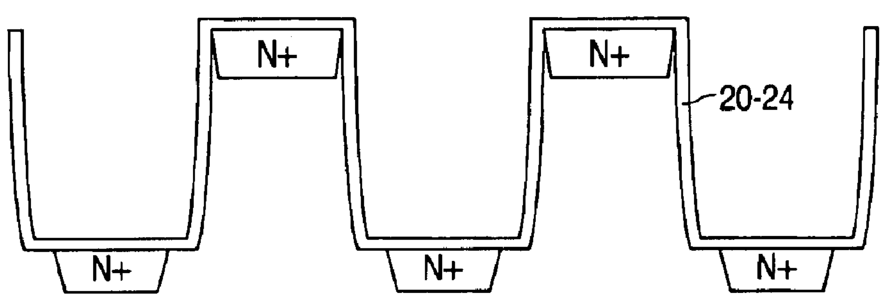
Figure 11K:
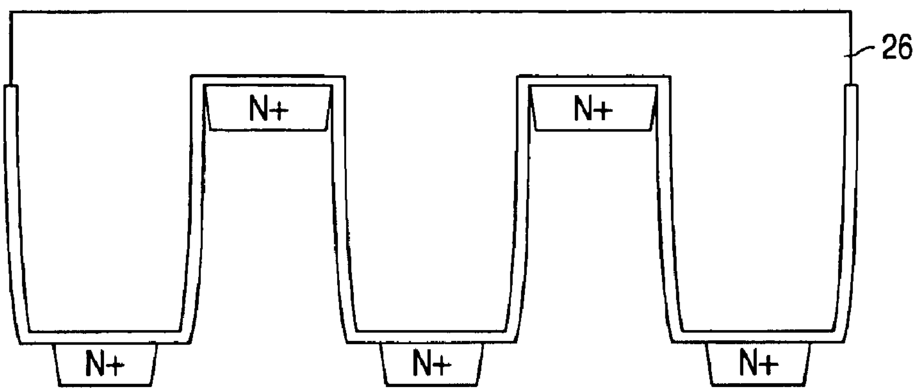
Figure 11L:
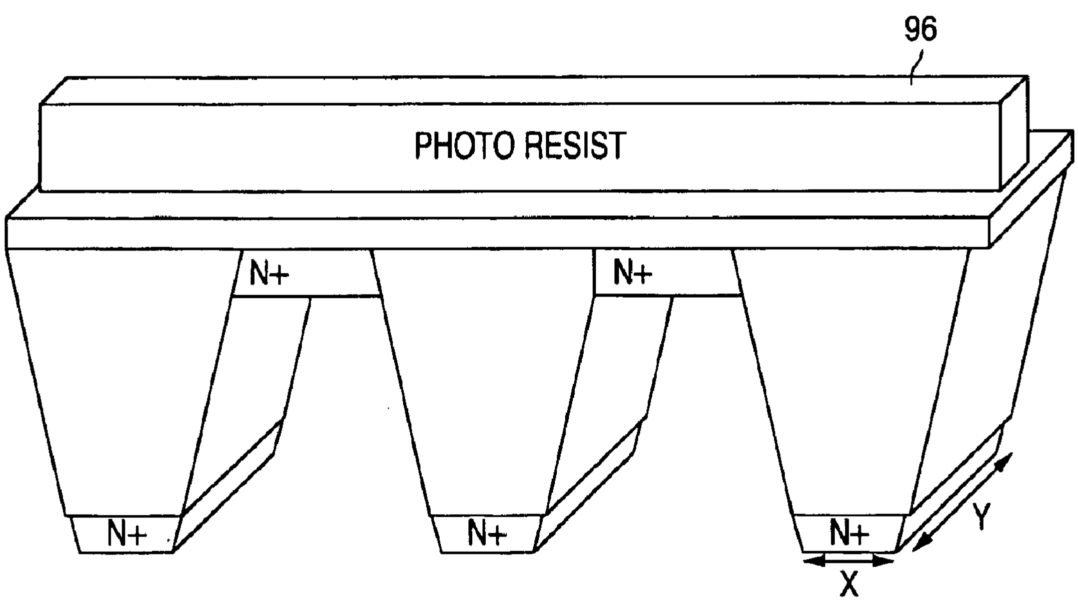
Figure 11M:
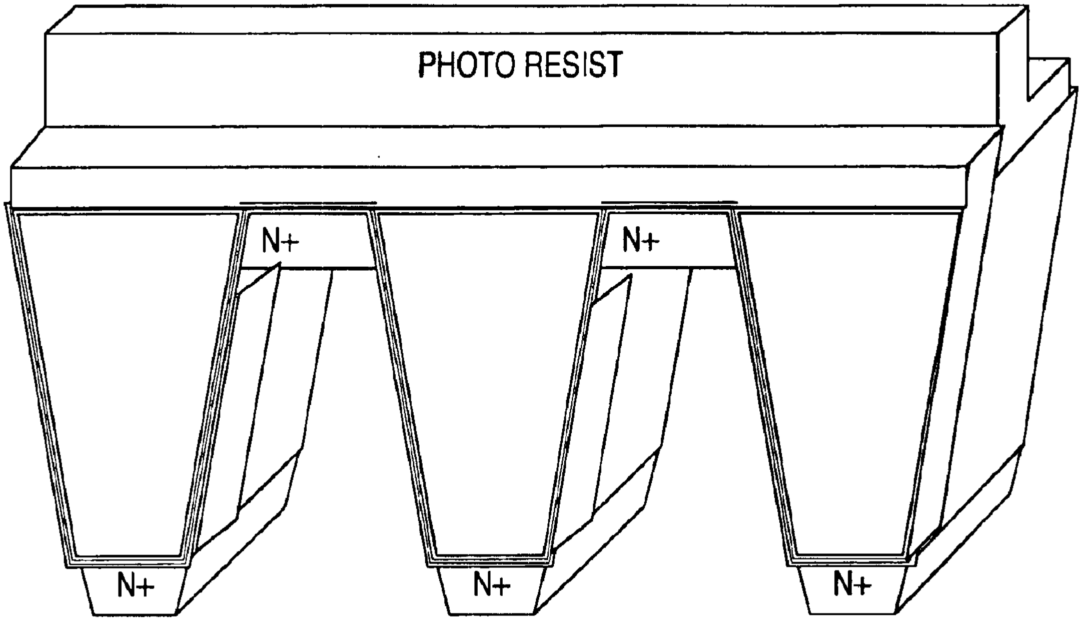
Figure 11N:
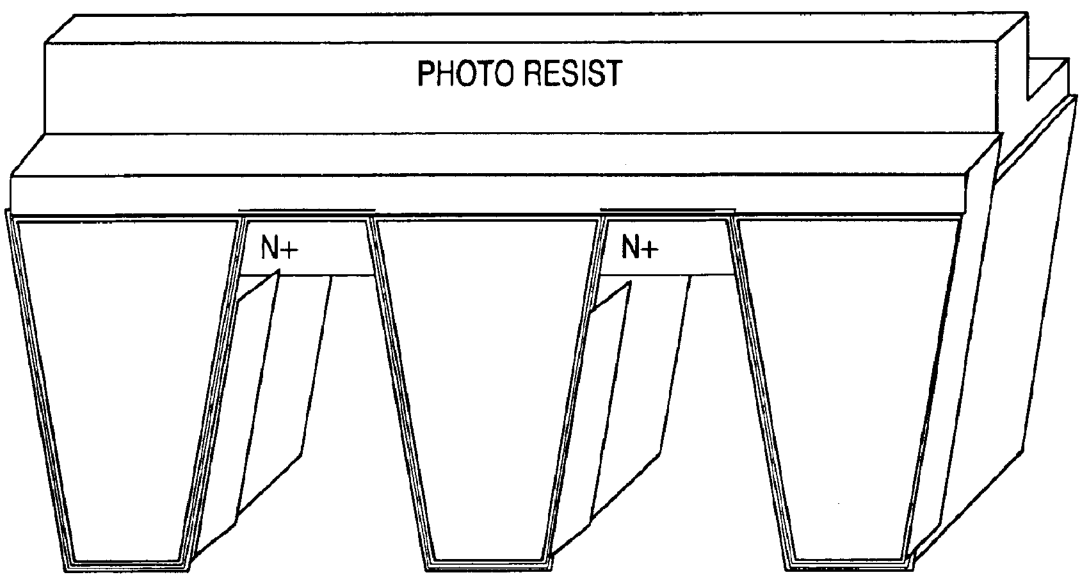
Figure 11O:
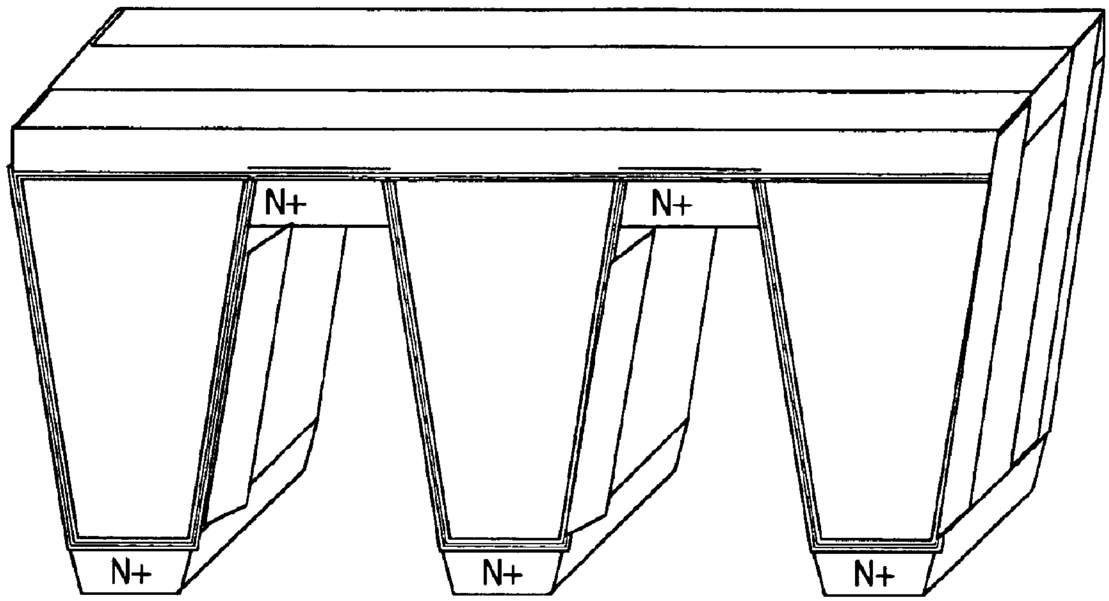

An N+ implant is made into the bottom portion 94 of each of the trenches 38 to form the first regions 14. The resultant structure is shown in FIG. 11G. Thereafter, the oxide spacers 92 along the side walls of the trenches 38 are removed. The resultant structure is shown in FIG. 11H. Thereafter, the strips of silicon nitride 90 are removed. The resultant structure is shown in FIG. 11I. Finally, the steps of the formation of the ONO layer 20–24, the filling of the trenches with polysilicon 26 and the deposition of spaced apart strips of photo resist 96 along the Y direction, the removal of the polysilicon 26 from the trenches that are not covered by the photo resist 96 and the replacement thereof by an insulating material, and finally the removal of the photo resist strips, all shown in steps 11J–11O are the same steps as shown and described in FIGS. 10I–10N.

From the foregoing, it can be seen that a highly dense compact vertical NROM device and method of making the same has been disclosed in which the channel region of an NROM device has a portion that is substantially perpendicular to the planar surface of the silicon substrate.

What is claimed is:

1. A non-volatile memory device comprising:

a substantially single crystalline semiconductive material of a first conductivity type having a planar surface;

a first region of a second conductivity type, different from said first conductivity type in said material;

a second region of said second conductivity type in said material;

a channel region connecting said first and second regions for the conduction of charges;

a dielectric spaced part from said channel region for trapping charges;

a gate electrode, spaced apart from said dielectric for controlling the conduction of charges in said channel region; and wherein said channel region has a portion which is substantially perpendicular to said planar surface.

2. The device of claim 1 wherein said channel region is in a trench, said trench having a top portion and a bottom portion.

3. The device of claim 2 wherein said first region is adjacent said top portion.

4. The device of claim 3 wherein said second region is adjacent said bottom portion.

5. The device of claim 2 wherein said top portion has two sides and said first region is adjacent a first side and said second region is adjacent a second side.

6. The device of claim 2 wherein said trench has a side wall connecting said top portion and said bottom portion, and said channel region is along said sidewall, and said gate electrode is in said trench.

7. The device of claim 6 wherein said dielectric is silicon nitride.

8. The device of claim 7 wherein said dielectric is spaced apart from said channel region by a layer of silicon dioxide.

9. The device of claim 8 wherein said gate electrode is spaced apart from said dielectric by a layer of silicon dioxide.

10. A non-volatile memory array comprising:

a substantially single crystalline semiconductive material of a first conductivity type having a planar surface;

a plurality of memory cells in said material, each memory cell comprising:

a first region of a second conductivity type different from said first conductivity type in said material;

a second region of said second conductivity type in said material;

a channel region connecting said first and second regions for the conduction of charges;

a dielectric spaced apart from said channel region for trapping charges;

a gate electrode spaced apart from said dielectric for controlling the conduction of charges in said channel region;

said channel region having a portion which is substantially perpendicular to said planar surface; and wherein adjacent memory cells have a common first region.

11. The array of claim 10 wherein each of said memory cells has a trench with a top portion and a bottom portion with said channel region in said trench.

12. The array of claim 11 wherein said first region is adjacent said top portion.

13. The array of claim 12 wherein said second region is adjacent said bottom portion.

14. The array of claim 11 wherein said top portion has two sides and said first region is adjacent a first side and said second region is adjacent a second side.

15. The array of claim 11 wherein said trench has a side wall connecting said top portion and said bottom portion, and said channel region is along said sidewall, and said gate electrode is in said trench.

16. The array of claim 15 wherein said dielectric is silicon nitride.

17. The array of claim 16 wherein said dielectric is spaced apart from said channel region by a layer of silicon dioxide.

18. The array of claim 17 wherein said gate electrode is spaced apart from said dielectric by a layer of silicon dioxide.

19. The array of claim 10 wherein said material is recrystallized polysilicon.

20. The array of claim 10 wherein said material is single crystalline silicon.

21. The array of claim 10 wherein said gate electrode of memory cells in a first direction are electrically connected.

22. The array of claim 21 wherein said first region of memory cells in a second direction, substantially perpendicular to the first direction, are electrically connected.

23. The array of claim 22 wherein said second region of memory cells in said second direction are electrically connected.

* * * * *